United States Patent
Kim et al.

(10) Patent No.: US 12,417,990 B2
(45) Date of Patent: Sep. 16, 2025

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Woon Chun Kim, Suwon-si (KR); Dae Seo Park, Suwon-si (KR); Jumyong Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 400 days.

(21) Appl. No.: 18/116,414

(22) Filed: Mar. 2, 2023

(65) Prior Publication Data

US 2024/0030169 A1 Jan. 25, 2024

(30) Foreign Application Priority Data

Jul. 21, 2022 (KR) ........................ 10-2022-0090194

(51) Int. Cl.
*H01L 23/00* (2006.01)

(52) U.S. Cl.
CPC .............. *H01L 24/08* (2013.01); *H01L 24/03* (2013.01); *H01L 24/05* (2013.01); *H01L 24/80* (2013.01); *H01L 2224/0345* (2013.01); *H01L 2224/0346* (2013.01); *H01L 2224/0384* (2013.01); *H01L 2224/03845* (2013.01); *H01L 2224/05018* (2013.01); *H01L 2224/05026* (2013.01); *H01L 2224/05073* (2013.01); *H01L 2224/05082* (2013.01); *H01L 2224/05144* (2013.01); *H01L 2224/05166* (2013.01); *H01L 2224/05181* (2013.01); *H01L 2224/05186* (2013.01); *H01L 2224/05562* (2013.01); *H01L 2224/05571* (2013.01); *H01L 2224/05647* (2013.01); *H01L 2224/08145* (2013.01); *H01L 2224/80004* (2013.01); *H01L 2224/80013* (2013.01); *H01L 2224/8002* (2013.01); *H01L 2224/80379* (2013.01); *H01L 2224/80895* (2013.01);

(Continued)

(58) Field of Classification Search
None
See application file for complete search history.

(56) References Cited

U.S. PATENT DOCUMENTS 6,051,496 A 4/2000 Jang
6,403,466 B1 6/2002 Lopatin (Continued)

*Primary Examiner* — Alexander G Ghyka
(74) *Attorney, Agent, or Firm* — Morgan, Lewis & Bockius LLP

(57) ABSTRACT

A semiconductor device includes a lower structure and an upper structure on the lower structure. The lower structure includes a first semiconductor substrate, a first pad and a first dielectric layer. The first dielectric layer surrounds the first pad and exposes a top surface of the first pad. The upper structure includes a second semiconductor substrate, a second pad and a second dielectric layer. The second dielectric layer surrounds the second pad and exposes a bottom surface of the second pad. The first pad and the second pad are bonded to each other across an interfacial layer to couple the upper and lower structures to each other. The first and second pads and the interfacial layer include a same metallic material. The first and second pads have a substantially same average grain size and the interfacial layer has a different average grain size than the first and second pads.

20 Claims, 16 Drawing Sheets

(52) U.S. Cl.
    CPC ............... *H01L 2224/80896* (2013.01); *H01L 2924/04941* (2013.01); *H01L 2924/04953* (2013.01); *H01L 2924/0544* (2013.01)

(56) References Cited

U.S. PATENT DOCUMENTS

| | | | |
|---|---|---|---|
| 6,518,173 B1 | 2/2003 | Chan | |
| 7,268,087 B2 | 9/2007 | Aoki et al. | |
| 9,099,534 B2 | 8/2015 | Watanabe et al. | |
| 10,950,578 B2* | 3/2021 | Lee | H01L 24/09 |
| 11,088,038 B2* | 8/2021 | Lee | H01L 25/0652 |
| 11,195,748 B2 | 12/2021 | Uzoh et al. | |
| 11,798,872 B2* | 10/2023 | Kweon | H01L 23/49838 |
| 2009/0224371 A1* | 9/2009 | Yu | H01L 24/06 |
| | | | 438/109 |
| 2021/0066233 A1 | 3/2021 | Fountain, Jr. et al. | |
| 2022/0208702 A1* | 6/2022 | Uzoh | H01L 24/08 |
| 2023/0070532 A1* | 3/2023 | Park | H01L 25/0657 |
| 2023/0138813 A1* | 5/2023 | Seo | H01L 25/0657 |
| | | | 257/774 |
| 2023/0230944 A1* | 7/2023 | Noh | H01L 24/83 |
| | | | 257/690 |

\* cited by examiner

SEMICONDUCTOR DEVICE AND METHOD OF FABRICATING THE SAME

CROSS-REFERENCE TO RELATED APPLICATION

This application claims priority under 35 U.S.C § 119 to Korean Patent Application No. 10-2022-0090194, filed on Jul. 21, 2022 in the Korean Intellectual Property Office, the disclosure of which is incorporated by reference in its entirety herein.

TECHNICAL FIELD

The present disclosure relates generally to a directly bonded semiconductor device and a method of fabricating the same.

DISCUSSION OF RELATED ART

In the semiconductor industry, consumer demand for high capacity, thin, and small/miniaturized semiconductor devices and electronic products using the same has increased. Various package techniques are in development to provide semiconductor devices having these features. One approach of the various package techniques is a packaging technique which vertically stacks a plurality of semiconductor chips to achieve a high density chip stacking. This packaging technique has an advantage of integrating semiconductor chips having various functions on a relatively small area as compared to a conventional package consisting of one semiconductor chip.

A semiconductor package is provided to implement an integrated circuit chip that is applied to electronic products. A semiconductor package is typically configured such that a semiconductor chip is mounted on a printed circuit board and bonding wires or bumps are used to electrically connect the semiconductor chip to the printed circuit board. With the development of electronic industry, research is being conducted for semiconductor packages having increased reliability and durability.

SUMMARY

Some embodiments of the present inventive concept provide a semiconductor device with improved structural stability and a method of fabricating the same.

Some embodiments of the present inventive concept provide a semiconductor package with increased electrical properties and increased operating stability and a method of manufacturing the same.

Some embodiments of the present inventive concepts provide a semiconductor fabrication method in which the occurrence of failure is reduced and a semiconductor device fabricated by the same.

According to some embodiments of the present inventive concepts, a semiconductor device includes a lower structure. An upper structure is on the lower structure. The lower structure includes a first semiconductor substrate. A first pad is on the first semiconductor substrate. A first dielectric layer is on the first semiconductor substrate. The first dielectric layer surrounds the first pad and exposes a top surface of the first pad. The upper structure includes a second semiconductor substrate. A second pad is on the second semiconductor substrate. A second dielectric layer is on the second semiconductor substrate. The second dielectric layer surrounds the second pad and exposes a bottom surface of the second pad. The first pad and the second pad are bonded to each other across an interfacial layer to couple the upper structure and the lower structure to each other. The first pad, the second pad, and the interfacial layer include a same metallic material. The first and second pads have a substantially same average grain size as each other and the interfacial layer has a different average grain size than the first and second pads.

According to some embodiments of the present inventive concepts, a semiconductor device includes a lower structure. An upper structure is on the lower structure. The lower structure includes a first semiconductor substrate. A first pad is on the first semiconductor substrate. A first dielectric layer is on the first semiconductor substrate. The first dielectric layer surrounds the first pad and exposes a top surface of the first pad. The upper structure includes a second semiconductor substrate. A second pad is on the second semiconductor substrate. A second dielectric layer is on the second semiconductor substrate. The second dielectric layer surrounds the second pad and exposes a bottom surface of the second pad. The first pad and the second pad are bonded to each other across an interfacial layer to couple the upper structure and the lower structure to each other. An interface between the first dielectric layer and the second dielectric layer is positioned at a level between a top surface and a bottom surface of the interfacial layer.

According to some embodiments of the present inventive concepts, a method of fabricating a semiconductor device includes forming an upper structure and a lower structure. The forming of the upper and lower structures includes forming a dielectric layer on a semiconductor substrate. A hole is formed in the dielectric layer. A plating process is performed. The plating process forms a conductive layer that fills the hole and covers the dielectric layer. A planarization process is performed on the conductive layer. The planarization process forms a pad in the hole. The pad includes a recess positioned on a top surface of the pad and extending towards the semiconductor substrate. A deposition process is performed. The deposition process forms a surface layer on the top surface of the pad. An argon (Ar) plasma treatment process is performed on the surface layer and the dielectric layer. After performing the argon plasma treatment process, a nitrogen (N) plasma treatment process is performed on the surface layer and the dielectric layer. The upper structure and the lower structure are placed in direct contact with each other. The placing vertically aligns the upper structure and the lower structure with each other and a dielectric layer of the upper structure directly contacts a dielectric layer of the lower structure. An annealing process is performed on the upper structure and the lower structure. After the nitrogen plasma treatment process is performed, copper nitride ($Cu_4N$) is formed on a top surface of the surface layer and silicon hydroxide (Si—OH) is formed on a top surface of the dielectric layer.

DETAILED DESCRIPTION OF EMBODIMENTS

The following will now describe a semiconductor device according to the present inventive concept with reference to accompanying drawings.

Figure 1:
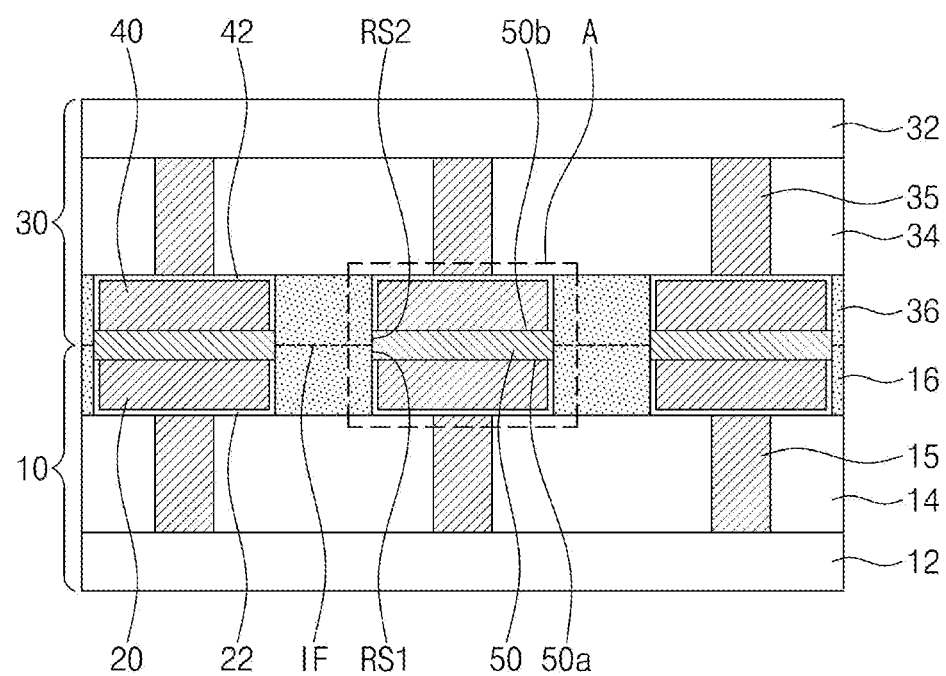
FIG. 1 illustrates a cross-sectional view showing a semiconductor device according to some embodiments of the present inventive concept.
Figure 2:
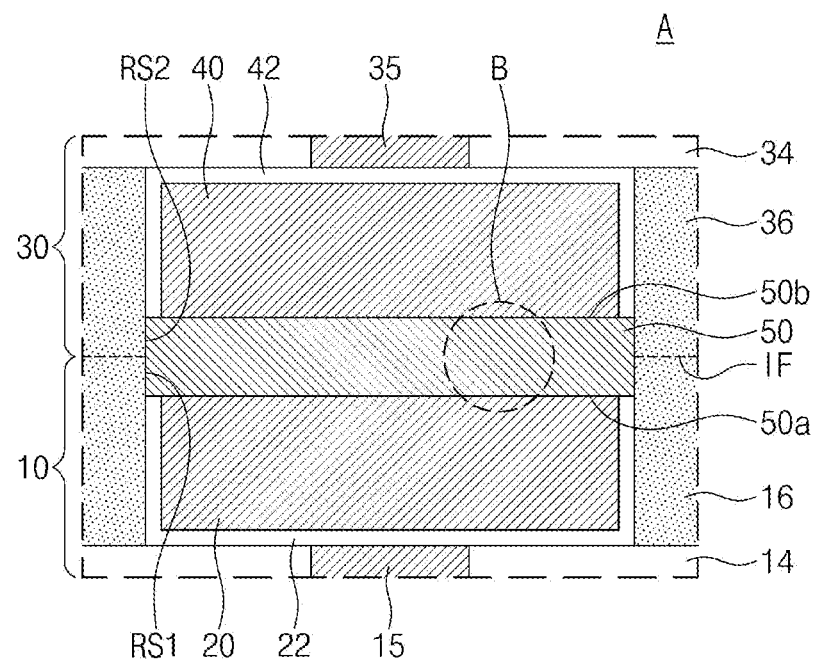
FIG. 2 illustrates an enlarged view showing section A of FIG. 1 according to some embodiments of the present inventive concept.
Figure 3:
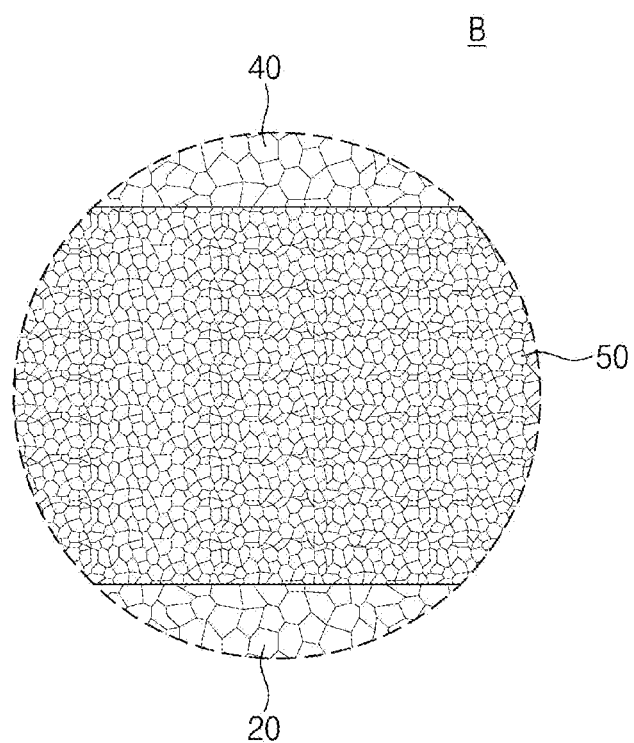
FIG. 3 illustrates an enlarged view showing section B of FIG. 2 according to some embodiments of the present inventive concept.

FIG. 1 illustrates a cross-sectional view showing a semiconductor device according to some embodiments of the present inventive concept. FIG. 2 illustrates an enlarged view showing section A of FIG. 1. FIG. 3 illustrates an enlarged view showing section B of FIG. 2.

Referring to FIG. 1, a semiconductor device may include a lower structure 10 and an upper structure 30 stacked on the lower structure 10.

The lower structure 10 may include a first substrate 12, a first circuit layer 14, a first dielectric layer 16, and first pads 20.

In an embodiment, the first substrate 12 may be a semiconductor substrate, such as a semiconductor wafer. The first substrate 12 may be a bulk silicon substrate, a silicon on insulator (SOI) substrate, a germanium substrate, a germanium on insulator (GOI) substrate, a silicon-germanium (SiGe) substrate, or an epitaxial film substrate obtained by performing a selective epitaxial growth (SEG) process. The first substrate 12 may include, for example, at least one compound selected from silicon (Si), germanium (Ge), silicon germanium (SiGe), gallium arsenic (GaAs), indium gallium arsenic (InGaAs), aluminum gallium arsenic (AlGaAs), and a mixture thereof. Alternatively, the first substrate 12 may be a dielectric substrate, such as a printed circuit board (PCB).

The first circuit layer 14 array be disposed on the first substrate 12. The first circuit layer 14 may be disposed on a top surface of the first substrate 12. The first circuit layer 14 may include a first circuit pattern provided on the first substrate 12 and a first interlayer dielectric layer that covers the first circuit pattern. In an embodiment, the first circuit pattern may be a memory circuit, a logic circuit, or a combination thereof, any of which circuits includes one or more transistors. Alternatively, the first circuit pattern may include a passive element, such as a resistor, an inductor, or a capacitor.

Referring to FIGS. 1 and 2, the first pads 20 may be disposed on the first circuit layer 14. The first pads 20 may be disposed on a top surface of the first circuit layer 14. The first pad 20 may have a width that is constant irrespective of a distance from the first substrate 12. Alternatively, differently from that shown in FIG. 1, in an embodiment the first pad 20 may have a width that decreases with decreasing distance from the first substrate 12. The first pad 20 may have a thickness that is substantially uniform. For example, the first pad 20 may have a plate shape. According to some embodiments, the first pad 20 may have a T-shaped cross-section including a via part and an overlying pad part that are integrally connected together. In an embodiment, the first pad 20 may have a circular planar shape. Alternatively, the first pad 20 may have a circular planar shape or a tetragonal planar shape. However, embodiments of the present inventive concept are not necessarily limited thereto, and the planar shape of the first pad 20 may be variously changed. In an embodiment, the first pad 20 may have a width ranging from about 2 μm to about 30 μm. However, embodiments of the present inventive concept are not necessarily limited thereto. The first pads 20 may include a metallic material. For example, in an embodiment the first pads 20 may include copper (Cu).

The first pads 20 may be electrically connected to the first circuit pattern of the first circuit layer 14. For example, as shown in FIG. 1, the first circuit layer 14 may include a first connection line 15 disposed therein. The first connection line 15 may be a through via that vertically penetrates the first interlayer dielectric layer in the first circuit layer 14. The first connection line 15 may vertically extend through the first circuit layer 14 to be coupled to the first pads 20. The first connection line 15 may electrically connect the first circuit pattern to the first pads 20. However, embodiments of the present inventive concept are not necessarily limited thereto and various conductive patterns may be provided for connection between the first circuit pattern and the first connection line 15. For example, differently from that shown in FIG. 1, in an embodiment the first connection line 15 may be an under-pad pattern or a redistribution pattern disposed in a dielectric pattern in the first circuit layer 14. In this embodiment, various conductive patterns may be included for connection between the first circuit pattern and the first connection line 15. However, embodiments of the present inventive concept are not necessarily limited thereto. For example, the first circuit layer 14 may be provided in various forms if necessary, and electrical connections of the first pads 20 and the first circuit layer 14 may be achieved through various configurations if necessary.

The first dielectric layer 16 may be disposed on the first circuit layer 14. On the top surface of the first circuit layer 14, the first dielectric layer 16 may surround the first pads 20. The top surfaces of the first pads 20 may be exposed by the first dielectric layer 16. For example, when viewed in a plan view, the first dielectric layer 16 may surround, but may not cover the first pads 20. A top surface of the first dielectric layer 16 may be located at a different level from that of the top surfaces of the first pads 20. For example, the top surface of the first dielectric layer 16 may be disposed farther from the first substrate 12 than the top surfaces of the first pads 20. In such a configuration, the top surfaces of the first pads 20 may have shapes that are recessed towards the first substrate 12 from the top surface of the first dielectric layer 16. Therefore, the first pads 20 may be disposed thereon with first recesses RS1 that are defined by the first dielectric layer 16 and the first pads 20. For example, on one of the first pads 20, the first recess RS1 may be surrounded by the first dielectric layer 16. In an embodiment, the first dielectric layer 16 may include oxide, nitride, or oxynitride of a material included in the first substrate 12 or the first circuit layer 14. In an embodiment, the first dielectric layer 16 may include a dielectric material, such as silicon oxide (SiO), silicon nitride (SiN), silicon oxynitride (SiON), or silicon carbonitride (SiCN). For example, the first dielectric layer 16 may include silicon oxide (SiO).

The first pad 20 may have a damascene structure in the first dielectric layer 16. For example, the first pads 20 may further include first seed/barrier patterns 22 that cover lateral and bottom surfaces of the first pads 20. The first seed/barrier patterns 22 may conformally cover the lateral and bottom surfaces of the first pads 20. The first seed/barrier patterns 22 may be interposed between the first pads 20 and the first dielectric layer 16 and between the first pads 20 and the first circuit layer 14. In an embodiment, a gap between the first pads 20 and the first dielectric layer 16, or a thickness of each of the first seed/barrier patterns 22 may be in a range of about 50 Å to about 1,000 Å. In an embodiment in which the first seed/barrier patterns 22 are used as seed patterns, the first seed/barrier patterns 22 may include metal, such as gold (Au). In an embodiment in which the first seed/barrier patterns 22 are used as barrier patterns, the first seed/barrier patterns 22 may include either metal such as titanium (Ti) and tantalum (Ta), or metal nitride such as titanium nitride (TiN) and tantalum nitride (TaN).

Referring back to FIG. 1, the upper structure 30 may be disposed on the lower structure 10. The upper structure 30 may include a second substrate 32, a second circuit layer 34, a second dielectric layer 36, and second pads 40.

In an embodiment, the second substrate 32 may be a semiconductor substrate, such as a semiconductor wafer. For example, the second substrate 32 may be a bulk silicon substrate, a silicon on insulator (SOI) substrate, a germanium substrate, a germanium on insulator (GOI) substrate, a silicon-germanium (SiGe) substrate, or an epitaxial film substrate obtained by performing a selective epitaxial growth (SEG) process. The second substrate 32 may include, for example, at least one compound selected from silicon (Si), germanium (Ge), silicon germanium (SiGe), gallium arsenic (GaAs), indium gallium arsenic (InGaAs), aluminum gallium arsenic (AlGaAs), and a mixture thereof. Alternatively, the second substrate 32 may be a dielectric substrate, such as a printed circuit board (PCB).

The second circuit layer 34 may be disposed on the second substrate 32. As shown in FIG. 1, the second circuit layer 34 may be disposed on a bottom surface of the second substrate 32. The second circuit layer 34 may include a second circuit pattern disposed on the second substrate 32 and a second interlayer dielectric layer that covers the second circuit pattern. In an embodiment, the second circuit pattern may be a memory circuit, a logic circuit, or a combination thereof, any of which circuits includes one or more transistors. Alternatively, the second circuit pattern may include a passive element, such as a resistor, an inductor, or a capacitor.

Referring back to FIGS. 1 and 2, the second pads 40 may be disposed on the second circuit layer 34. The second pads 40 may be disposed on a bottom surface of the second circuit layer 34. The second pad 40 may have a width that is constant irrespective of a distance from the second substrate 32. Alternatively, differently from that shown in FIG. 1, in an embodiment the second pad 40 may have a width that decreases with decreasing distance from the second substrate 32. The second pad 40 may have a thickness that is substantially uniform. For example, the second pad 40 may have a plate shape. According to some embodiments, the second pad 40 may have a T-shaped cross-section including a via part and an overlying pad part that are integrally connected together. The second pad 40 may have a circular planar shape. Alternatively, the second pad 40 may have a circular planar shape or a tetragonal planar shape. However, embodiments of the present inventive concept are not necessarily limited thereto, and the planar shape of the second pad 40 may be variously changed if necessary. The second pad 40 may have a width ranging from about 2 μm to about 30 μm. However, embodiments of the present inventive concept are not necessarily limited thereto. A material included in the second pads 40 may be the same as that included in the first pads 20. The second pads 40 may include a metallic material. For example, the second pads 40 may include copper (Cu).

The second pads 40 may be electrically connected to the second circuit pattern of the second circuit layer 34. For example, as shown in FIG. 1, the second circuit layer 34 may include a second connection line 35 disposed therein. The second connection line 35 may be a through via that vertically penetrates the second interlayer dielectric layer in the second circuit layer 34. The second connection line 35 may vertically extend in the second circuit layer 34 to be coupled to the second pads 40. The second connection line 35 may electrically connect the second circuit pattern to the second pads 40. However, embodiments of the present inventive concept are not necessarily limited thereto and various conductive patterns may be provided for connection between the second circuit pattern and the second connection line 35. For example, differently from that shown in FIG. 1, the second connection line 35 may be an under-pad pattern or a redistribution pattern included in a dielectric pattern in the second circuit layer 34. In this embodiment, various conductive patterns may be included for connection between the second circuit pattern and the second connection line 35. However, embodiments of the present inventive concept are not necessarily limited thereto. For example, the second circuit layer 34 may be provided in various forms and electrical connections of the second pads 40 and the second circuit layer 34 may be achieved through various configurations.

The second dielectric layer 36 may be disposed on the second circuit layer 34. On the bottom surface of the second circuit layer 34, the second dielectric layer 36 may surround the second pads 40. The bottom surfaces of the second pads 40 may be exposed by the second dielectric layer 36. For example, when viewed in a plan view, the second dielectric layer 36 may surround, but may not cover the second pads 40. The second dielectric layer 36 may have a bottom surface located at a different level from that of the bottom surfaces of the second pads 40. For example, the bottom surface of the second dielectric layer 36 may be disposed farther from the second substrate 32 than the bottom surfaces of the second pads 40. In such a configuration, the bottom surfaces of the second pads 40 may have shapes that are recessed towards the second substrate 32 from the bottom surface of the second dielectric layer 36. Therefore, the second pads 40 may include second recesses RS2 that are defined by the second dielectric layer 36 and the second pads 40. For example, on one of the second pads 40, the second recess RS2 may be surrounded by the second dielectric layer 36. In an embodiment, the second dielectric layer 36 may include oxide, nitride, or oxynitride of a material included in the second substrate 32 or the second circuit layer 34. For example, the second dielectric layer 36 may include a dielectric material, such as silicon oxide (SiO), silicon nitride (SiN), silicon oxynitride (SiON), or silicon carbonitride (SiCN). For example, the second dielectric layer 36 may include silicon oxide (SiO).

The second pad 40 may have a damascene structure in the second dielectric layer 36. For example, the second pads 40 may further include second seed/barrier patterns 42 that cover lateral and top surfaces of the second pads 40. The second seed/barrier patterns 42 may conformity cover the lateral and top surfaces of the second pads 40. The second seed/barrier patterns 42 may be interposed between the second pads 40 and the second dielectric layer 36 and between the second pads 40 and the second circuit layer 34. In an embodiment, a gap between the second pads 40 and the second dielectric layer 36, or a thickness of each of the second seed/barrier patterns 42 may be in a range of about 50 Å to about 1,000 Å. In an embodiment in which the second seed/barrier patterns 42 are used as seed patterns, the second seed/barrier patterns 42 may include metal, such as gold (Au). In an embodiment in which the second seed/barrier patterns 42 are used as barrier patterns, the second seed/barrier patterns 42 may include either metal such as titanium (Ti) and tantalum (Ta), or metal nitride such as titanium nitride (TiN) and tantalum nitride (TaN).

The upper structure 30 may be disposed on the lower structure 10. The first pads 20 of the lower structure 10 may be vertically aligned with the second pads 40 of the upper structure 30. The lower structure 10 and the upper structure 30 may be in direct contact with each other.

The first dielectric layer 16 of the lower structure 10 and the second dielectric layer 36 of the upper structure 30 may be bonded at an interface between the lower structure 10 and the upper structure 30. In this embodiment, the first dielectric layer 16 and the second dielectric layer 36 may constitute a hybrid bonding of oxide, nitride, or oxynitride. In this description, the term "hybrid bonding" may denote a bonding in which two components of the same kind are merged at an interface therebetween. For example, the first dielectric layer 16 and the second dielectric layer 36 may have a continuous configuration, and an invisible interface IF may be provided between the first dielectric layer 16 and the second dielectric layer 36. However, embodiments of the present inventive concept are not necessarily limited thereto. For example, the first dielectric layer 16 and the second dielectric layer 36 may be formed of the same material, and thus no interface may be present between the first dielectric layer 16 and the second dielectric layer 36. Thus, the first dielectric layer 16 and the second dielectric layer 36 may be provided as a single component. For example, the first dielectric layer 16 and the second dielectric layer 36 may be combined to form a single unitary body. However, embodiments of the present inventive concept are not necessarily limited thereto. For example, the first dielectric layer 16 and the second dielectric layer 36 may be formed of different materials. The first dielectric layer 16 and the second dielectric layer 36 may not have a continuous configuration, and the interface IF may be visible between the first dielectric layer 16 and the second dielectric layer 36. The first dielectric layer 16 and the second dielectric layer 36 may not be coupled to each other, and may each be provided in an individual component. The following description will focus on the embodiment of FIGS. 1 and 2 for convenience of explanation.

The upper structure 30 may be connected to the lower structure 10. For example, the lower structure 10 and the upper structure 30 may be in direct contact with each other. The first pads 20 of the lower structure 10 may be electrically connected to the second pads 40 of the upper structure 30.

Interfacial layers 50 may be positioned between the first pads 20 and the second pads 40. Each of the interfacial layers 50 may be interposed between one of the first pads 20 and one of the second pads 40. The interfacial layers 50 may separate the first pads 20 from the second pads 40. The interfacial layers 50 may be in direct contact with the top surfaces of the first pads 20 and with the bottom surfaces of the second pads 40. For example, in an embodiment entireties of the top surfaces of the first pads 20 may be in direct contact with entireties of bottom surfaces 50a of the interfacial layers 50, and entireties of the bottom surfaces of the second pads 40 may be in direct contact with entireties of top surfaces 50b of the interfacial layers 50. In this embodiment, entireties of interfaces between the first pads 20 and the interfacial layers 50 may be used in bonding between the first pads 20 and the interfacial layers 50, and entireties of interfaces between the second pads 40 and the interfacial layers 50 may be used in bonding between the second pads 40 and the interfacial layers 50.

According to some embodiments of the present inventive concept, the interfacial layers 50 and the first and second pads 20 and 40 may be entirely bonded without impurities therebetween. Therefore, the interfacial layers 50 may be strongly bonded to the first and second pads 20 and 40, and a semiconductor device may increase structural stability.

In addition, neither empty spaces nor other materials may be interposed between the interfacial layers 50 and the first and second pads 20 and 40. Therefore, a small interfacial resistance may be provided between the interfacial layers 50 and the first and second pads 20 and 40, and a semiconductor device may increase in electrical properties and operating stability.

The overall bonding between the interfacial layers 50 and the first and second pads 20 and 40 may be achieved by a method of fabricating a semiconductor device according to some embodiments of the present inventive concept, and this will be further discussed in detail below.

The first circuit layer 14 and the second circuit layer 34 may be electrically connected through the first pads 20, the interfacial layers 50, and the second pads 40. The bottom surfaces 50a of the interfacial layers 50 may be closer to the first substrate 12 than the top surface of the first dielectric layer 16. For example, the bottom surfaces 50a of the interfacial layers 50 may be located at a lower level than that of the interface IF between the first dielectric layer 16 and the second dielectric layer 36. In such a configuration, lower portions of the interfacial layers 50 may fill the first recesses RS1. The top surfaces 50b of the interfacial layers 50 may be closer to the second substrate 32 than the bottom surface of the second dielectric layer 36. For example, the top surfaces 50b of the interfacial layers 50 may be located at a higher level than that of the interface IF between the first dielectric layer 16 and the second dielectric layer 36. In such a configuration, upper portions of the interfacial layers 50 may fill the second recesses RS2. As the upper structure 30 and the lower structure 10 are bonded to each other, the first recesses RS1 and the second recesses RS2 may be connected to form internal spaces, and the interfacial layers 50 may be positioned in the internal spaces.

In an embodiment, the interfacial layer 50 may have a thickness that is substantially uniform. For example, the interfacial layer 50 may have a plate shape. A material included in the interfacial layers 50 may be the same as that included in the first pads 20 and that included in the second pads 40. The interfacial layers 50 may include a metallic material. For example, the interfacial layers 50 may include copper (Cu).

Referring to FIGS. 1, 2 and 3, in an embodiment an average grain size of the first pads 20 may be substantially the same as or similar to that of the second pads 40. An average grain size of the interfacial layers 50 may be less than that of the first pads 20 and that of the second pads 40. In this description, an average grain area may be obtained by dividing a certain area by the number of grains included in the certain area, and the diameter of a circle having the average grain area may be defined as an average grain size. Alternatively, an average grain size may be determined by diameter measurement, ASTM grain size number, or the like. The phrase "average grain sizes of certain components are substantially the same as each other" may mean that a difference in average grain sizes of the components is less than about 10%. For convenience of description, FIG. 3 exaggerates grain sizes, and size ratios between grains and components of a semiconductor device may be different from actual ratios. Although FIG. 3 depicts grain sizes of the first pads 20, the second pads 40, and the interfacial layers 50, this illustration shows by way of example a comparison between grain sizes of the interfacial layers 50 and grain sizes of the first and second pads 20 and 40. However, embodiments of the present inventive concept are not necessarily limited thereto. As the average grain size of the first and second pads 20 and 40 is different from that of the interfacial layers 50, the first and second pads 20 and 40 and the interfacial layers 50 may be physically distinguishable from each other even in an embodiment in which the first and second pads 20 and 40 and the interfacial layers 50 are formed of the same material. For example, visible interfaces may be provided between the interfacial layers 50 and the first and second pads 20 and 40.

The interfacial layers 50 may be in direct contact with the first seed/barrier patterns 22 and the second seed/barrier patterns 42. For example, uppermost surfaces of the first seed/barrier patterns 22 may be in direct contact with the bottom surfaces 50a of the interfacial layers 50, and lowermost surfaces of the second seed/barrier patterns 42 may be in direct contact with the top surfaces 50b of the interfacial layers 50. In an embodiment, the interfacial layer 50 may have a width that is the same as an overall width of the first seed/barrier pattern 22 and an overall width of the second seed/barrier pattern 42. For example, lateral surfaces of the interfacial layers 50 may be aligned with outer lateral surfaces of the first seed/barrier patterns 22 and lateral surfaces of the second seed/barrier patterns 42.

In the embodiments that follow, a detailed description of technical features repetitive to those discussed above with reference to FIGS. 1, 2 and 3 will be omitted, and a difference thereof will be discussed in detail for economy of description. The same reference numerals may refer to the same components as those of the semiconductor package according to some embodiments of the present inventive concept.

Figure 4:
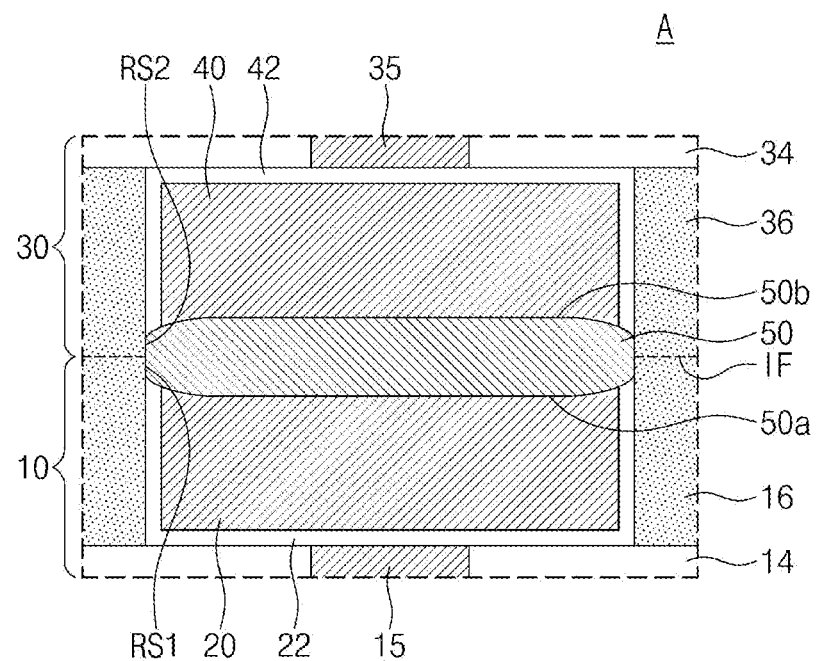
FIGS. 4, 5, 6 and 7 illustrate cross-sectional views of Section A depicted in FIG. 1, showing a semiconductor device according to some embodiments of the present inventive concept.

FIG. 4 illustrates a cross-sectional view of Section A depicted in FIG. 1, showing a semiconductor device according to some embodiments of the present inventive concept.

Referring to FIGS. 1 and 4, the interfacial layers 50 may be disposed between the first pads 20 and the second pads 40. Each of the interfacial layers 50 may be interposed between one of the first pads 20 and one of the second pads 40. The interfacial layers 50 may separate the first pads 20 from the second pads 40. The interfacial layers 50 may be in direct contact with the top surfaces of the first pads 20 and with the bottom surfaces of the second pads 40. For example, in an embodiment entireties of the top surfaces of the first pads 20 may be in direct contact with of the bottom surfaces 50a of the interfacial layers 50, and entireties of the bottom surfaces of the second pads 40 may be in direct contact with entireties of the top surfaces 50b of the interfacial layers 50.

The interfacial layer 50 may have a non-uniform thickness. For example, a thickness at a lateral edge portion of the interfacial layer 50 may be less than that at a central portion of the interfacial layer 50. The thickness of the interfacial layer 50 may increase in a direction from the edge portion of the interfacial layer 50 towards the central portion. As the entireties of the top surfaces of the first pads 20 are in direct contact with the entireties of the bottom surfaces 50a of the interfacial layers 50, thicknesses at edge portions of the first pads 20 may be greater than those at central portions of the first pads 20. As the entireties of the bottom surfaces of the second pads 40 are in direct contact with the entireties of the top surfaces 50b of the interfacial layers 50, thicknesses at edge portions of the second pads 40 may be greater those at central portions of the second pads 40.

Figure 5:
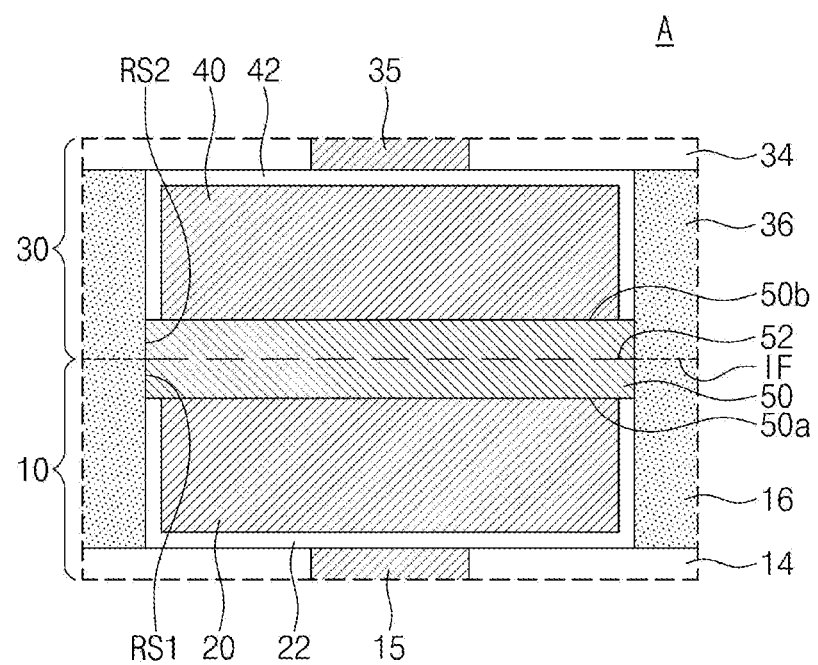

FIG. 5 illustrates a cross-sectional view of section A depicted in FIG. 1, showing a semiconductor device according to some embodiments of the present inventive concept.

Referring to FIG. 5, the interfacial layers 50 may be disposed between the first pads 20 and the second pads 40. Each of the interfacial layers 50 may be interposed between one of the first pads 20 and one of the second pads 40. The interfacial layers 50 may separate the first pads 20 from the second pads 40. The interfacial layers 50 may be in direct contact with the top surfaces of the first pads 20 and with the bottom surfaces of the second pads 40. For example, in an embodiment entireties of the top surfaces of the first pads 20 may be in direct contact with an entirety of the bottom surfaces 50a of the interfacial layers 50, and entireties of the bottom surfaces of the second pads 40 may be in direct contact with entireties of the top surfaces 50b of the interfacial layers 50.

In an embodiment, each of the interfacial layers 50 may contain an impurity. The following will describe a single interfacial layer 50. The impurity may be contained in a portion 52 of the interfacial layer 50 that is positioned at an intermediate location between the top surface 50b and the bottom surface 50a of the interfacial layer 50. For example, a distance between the portion 52 and the top surface 50b of the interfacial layer 50 may be substantially the same as or similar to that between the portion 52 and the bottom surface 50a of the interfacial layer 50. Alternatively, the portion 52 of the interfacial layer 50 may be located at the same level as that of the interface IF between the first dielectric layer 16 and the second dielectric layer 36. In FIG. 5, the portion 52 of the interfacial layer 50 is illustrated in the form of a layer so as to explain a position of the portion 52 of the interfacial layer 50. However, the portion 52 may not be completely separate from upper and lower portions of the interfacial layer 50. For example, in an embodiment the impurity may be irregularly and partially contained in the interfacial layer 50. In this sense, the interfacial layer 50 may partially contain the impurity at a location at the same level as that of the interface IF between the first dielectric layer 16 and the second dielectric layer 36. A concentration of the impurity may decreases in a direction towards the top surface 50b of the interfacial layer 50 and in a direction towards the bottom surface 50a of the interfacial layer 50. In an embodiment, the impurity may include a nitrogen (N) element. The impurity may be a component that remains in the interfacial layer 50 in a procedure for forming a semiconductor device according to a semiconductor fabrication method in accordance with some embodiments of the present inventive concept, and this will be discussed in detail together with a subsequently described method of fabricating a semiconductor device.

Figure 6:
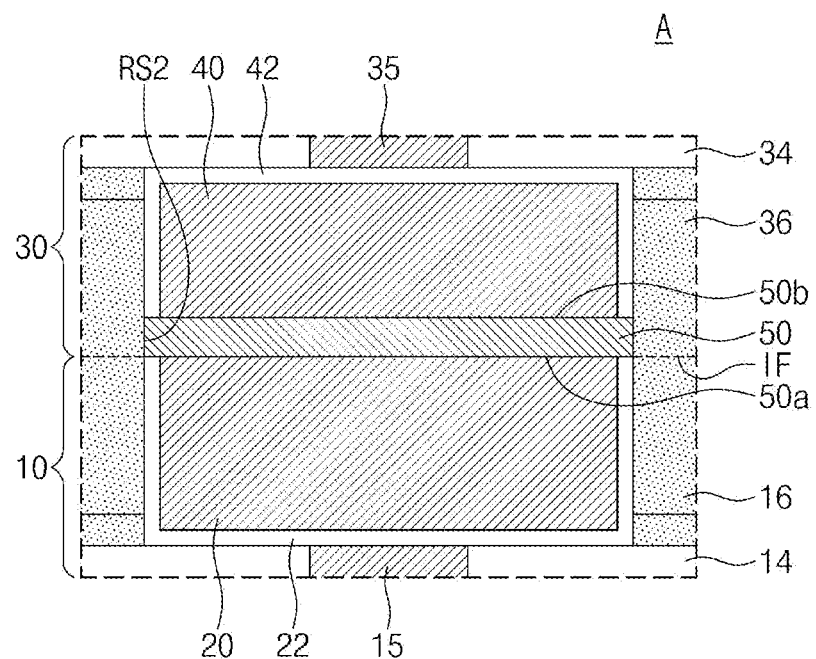
Figure 7:
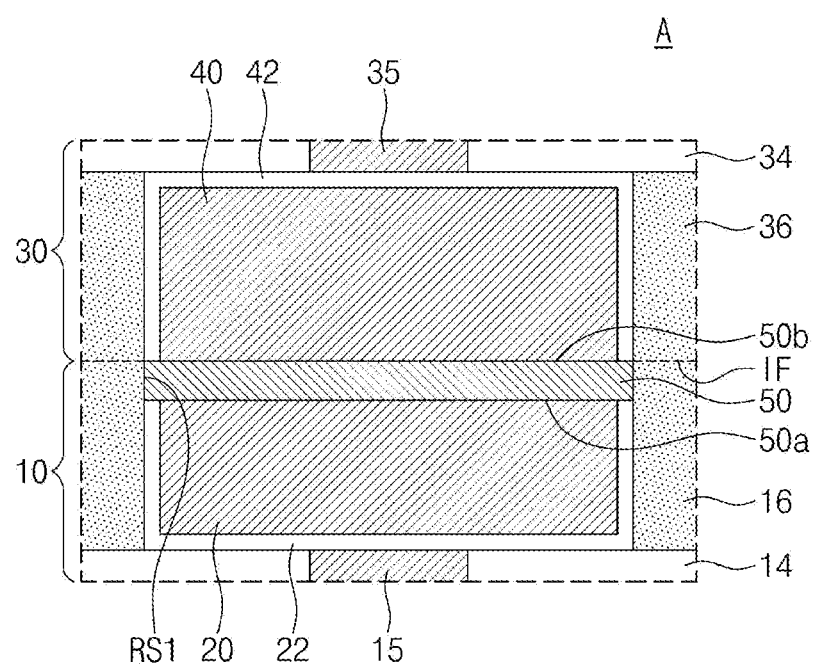

FIGS. 6 and 7 illustrate cross-sectional views of section a depicted in FIG. 1, showing a semiconductor device according to some embodiments of the present inventive concept.

In embodiments shown in FIGS. 1, 2, 3, 4 and 5 the bottom surfaces 50a of the interfacial layers 50 are located at a lower level than that of the interface IF between the first dielectric layer 16 and the second dielectric layer 36, and the top surfaces 50b of the interfacial layers 50 are located at a higher level than that of the interface IF between the first dielectric layer 16 and the second dielectric layer 36. However, embodiments of the present inventive concept are not necessarily limited thereto.

Referring to FIG. 6, the interfacial layers 50 may be positioned solely in the upper structure 30.

The first dielectric layer 16 may have a top surface located at the same level as that of the top surfaces of the first pads 20. For example, the top surface of the first dielectric layer 16 may be coplanar with those of the first pads 20. Thus, the first pads 20 may not include the first recesses RS1 discussed with reference to FIGS. 1, 2, 3, 4, and 5.

The second dielectric layer 36 may have a bottom surface located at a different level from that of the bottom surfaces of the second pads 40. For example, the bottom surface of the second dielectric layer 36 may be disposed farther from the second substrate 32 than the bottom surfaces of the second pads 40. In such a configuration, the shapes of the bottom surfaces of the second pads 40 may be recessed towards the second substrate 32 from the bottom surface of the second dielectric layer 36. Therefore, the second pads 40 may include second recesses RS2 that are defined by the second dielectric layer 36 and the second pads 40. For example, on one of the second pads 40, the second recess RS2 may be surrounded by the second dielectric layer 36.

The first circuit layer 14 and the second circuit layer 34 may be electrically connected through the first pads 20, the interfacial layers 50, and the second pads 40. The bottom surfaces 50a of the interfacial layers 50 may be located at the same level as that of the bottom surface of the second dielectric layer 36. For example, the bottom surfaces 50a of the interfacial layers 50 may be coplanar with the interface IF between the first dielectric layer 16 and the second dielectric layer 36. The top surfaces 50b of the interfacial layers 50 may be closer to the second substrate 32 than the bottom surface of the second dielectric layer 36. For example, the top surfaces 50b of the interfacial layers 50 may be located at a higher level than that of the interface IF between the first dielectric layer 16 and the second dielectric layer 36. In such a configuration, entireties of the interfacial layers 50 may fill the second recesses RS2.

According to some embodiments, referring to FIG. 7, the interfacial layers 50 may be positioned in the lower structure 10.

The first dielectric layer 16 may have a top surface located at a different level from that of the top surfaces of the first pads 20. For example, the top surface of the first dielectric layer 16 may be disposed farther from the first substrate 12 than the top surface of the first pads 20. In such a configuration, the shapes of the top surfaces of the first pads 20 may be recessed towards the first substrate 12 from the top surface of the first dielectric layer 16. Therefore, the first pads 20 may include first recesses RS1 that are defined by the first dielectric layer 16 and the first pads 20. For example, on one of the first pads 20, the first recess RS1 may be surrounded by the first dielectric layer 16.

The second dielectric layer 36 may have a bottom surface located at a same level from that of the bottom surfaces of the second pads 40. For example, the bottom surface of the second dielectric layer 36 may be coplanar with those of the second pads 40. In this sense, the second pads 40 may not include the second recesses RS2 discussed with reference to embodiments of FIGS. 1, 2, 3, 4, and 5.

The first circuit layer 14 and the second circuit layer 34 may be electrically connected through the first pads 20, the interfacial layers 50, and the second pads 40. The top surfaces 50b of the interfacial layer 50 may be located at the same level as that of the top surface of the first dielectric layer 16. For example, the top surfaces 50b of the interfacial layers 50 may be coplanar with the interface IF between the first dielectric layer 16 and the second dielectric layer 36. The bottom surfaces 50a of the interfacial layers 50 may be closer to the first substrate 12 than the top surface of the first dielectric layer 16. For example, the bottom surfaces 50a of the interfacial layers 50 may be located at a lower level than that of the interface IF between the first dielectric layer 16 and the second dielectric layer 36. In such a configuration, entireties of the interfacial layers 50 may fill the first recesses RS1.

Figure 8:
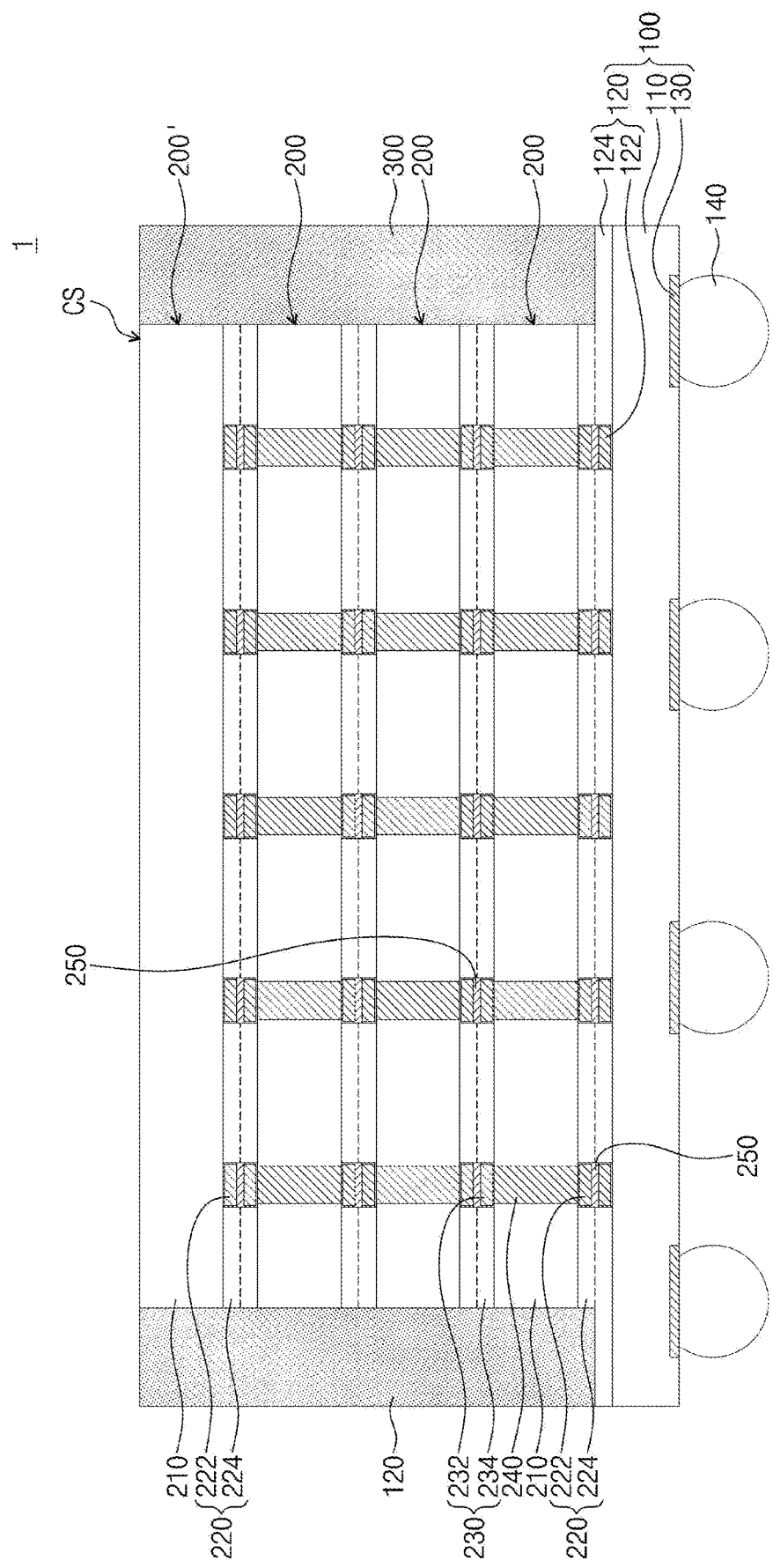
FIG. 8 illustrates a cross-sectional view showing a semiconductor device according to some embodiments of the present inventive concept.

FIG. 8 illustrates a cross-sectional view showing a semiconductor device 1 according to some embodiments of the present inventive concept.

Referring to FIG. 8, a substrate 100 may be provided. In an embodiment, the substrate 100 may be a package substrate such as a printed circuit board (PCB) or an interposer substrate provided in a package. Alternatively, the substrate 100 may be a semiconductor substrate on which semiconductor elements are formed or integrated. The substrate 100 may include a substrate base layer 110 and a substrate wiring layer 120 disposed on the substrate base layer 110.

The substrate wiring layer 120 may include first substrate pads 122 exposed on a top surface of the substrate base layer 110 and a substrate protection layer 124 that covers the substrate base layer 110 and surrounds the first substrate pads 122. The first substrate pads 122 may correspond to the first pads 20 discussed with reference to FIGS. 1, 2, 3, 4, and 5. For example, top surfaces of the first substrate pads 122 may be located at a lower level than that of a top surface of the substrate protection layer 124. For example, the first substrate pads 122 may include recesses that are defined by the first substrate pads 122 and the substrate protection layer 124. Alternatively, identically or similarly to that discussed with reference to FIG. 6, the top surfaces of the first substrate pads 122 may be coplanar with the top surface of the substrate protection layer 124.

The substrate base layer 110 may include second substrate pads 130 that are exposed on a bottom surface of the substrate base layer 110. The substrate 100 may redistribute a chip stack CS which will be discussed below. For example, in an embodiment the first substrate pads 122 and the second substrate pads 130 may be electrically connected through a circuit line in the substrate base layer 110, and a redistribution circuit may be constituted by the circuit line, the first substrate pads 122, and the second substrate pads 130. The first substrate pads 122 and the second substrate pads 130 may include a conductive material, such as metal. In an embodiment, the first substrate pads 122 and the second substrate pads 130 may include, for example, copper (Cu). In an embodiment, the substrate protection layer 124 may include a dielectric material, such as oxide, nitride, or oxynitride of a material included in the substrate base layer 110. For example, the substrate protection layer 124 may include silicon oxide (SiO). However, embodiments of the present inventive concept are not necessarily limited thereto.

The substrate 100 may have substrate connection terminals 140 disposed on a bottom surface thereof. The substrate connection terminals 140 may be disposed on the second substrate pads 130 of the substrate 100. The substrate connection terminals 140 may include solder balls or solder bumps. In accordance with type and arrangement of the substrate connection terminals 140, the semiconductor device 1 may be a ball grid array (BGA), fine ball grid array (FBGA), or land grid array (LGA). However, embodiments of the present inventive concept are not necessarily limited thereto.

A chip stack CS may be disposed on the substrate 100. The chip stack CS may include one or more semiconductor chips 200 and 200' that are stacked on the substrate 100. In an embodiment, each of the semiconductor chips 200 and 200' may be a memory chip, such as DRAM, SRAM, MRAM, or flash memory. Alternatively, each of the semiconductor chips 200 and 200' may be a logic chip. FIG. 8 depicts that a single chip stack CS is disposed. However, embodiments of the present inventive concept are not necessarily limited thereto. In an embodiment in which the chip stack CS is provided in plural, the plurality of chip stacks CS may be spaced apart from each other on the substrate 100.

A single semiconductor chip 200 may be mounted on the substrate 100. The semiconductor chip 200 may include a semiconductor material, such as silicon (Si). The semiconductor chip 200 may include a chip base layer 210, a first chip wiring layer 220 disposed on a side of a front surface of the semiconductor chip 200 from the chip base layer 210, and a second chip wiring layer 230 disposed on a side of a rear surface of the semiconductor chip 200 from the chip base layer 210. In this description, the language "front surface" may be defined to indicate an active surface of an integrated element in a semiconductor chip or a surface on which are formed a plurality of pads of a semiconductor chip, and the language "rear surface" may be defined to indicate an opposite surface that faces the front surface.

The first chip wiring layer 220 may include first chip pads 222 on the chip base layer 210 and a first chip protection layer 224 by which the first chip pads 222 are surrounded on the chip base layer 210. The first chip pads 222 may correspond to the second pads 40 discussed with reference to FIGS. 1, 2, 3, 4 and 5. For example, bottom surfaces of the first chip pads 222 may be located at a higher level than that of a bottom surface of the first chip protection layer 224. In such a configuration, the first chip pads 222 may include recesses that are defined by the first chip pads 222 and the first chip protection layer 224. Alternatively, identically or similarly to that discussed with reference to FIG. 7, in an embodiment the bottom surfaces of the first chip pads 222 may be coplanar with the bottom surface of the first chip protection layer 224. The first chip pads 222 may be electrically connected to an integrated element or integrated circuits in the semiconductor chip 200. According to some embodiments, wiring lines for redistribution may be disposed between the first chip pads 222 and an integrated element in the semiconductor chip 200. The first chip pads 222 may include a conductive material, such as metal. For example, in an embodiment the first chip pads 222 may include copper (Cu). The first chip protection layer 224 may include a dielectric material. For example, in an embodiment the first chip protection layer 224 may include silicon oxide (SiO).

The second chip wiring layer 230 may include second chip pads 232 disposed on the chip base layer 210 and a second chip protection layer 234 by which the second chip pads 232 are surrounded on the chip base layer 210. The second chip pads 232 may correspond to the first pads 20 discussed with reference to FIGS. 1, 2, 3, 4 and 5. For example, top surfaces of the second chip pads 232 may be located at a lower level than that of a top surface of the second chip protection layer 234. In such a configuration, the second chip pads 232 may include recesses that are defined by the second chip pads 232 and the second chip protection layer 234. Alternatively, identically or similarly to that discussed with reference to FIG. 6, the top surfaces of the second chip pads 232 may be coplanar with the top surface of the second chip protection layer 234. The second chip pads 232 may be electrically connected to the first chip wiring layer 220. According to some embodiments, the second chip pads 232 may be coupled to the first chip wiring layer 220 by means of through electrodes 240 that vertically penetrate the chip base layer 210. The second chip pads 232 may include a conductive material, such as metal. For example, in an embodiment the second chip pads 232 may include copper (Cu). The second chip protection layer 234 may include a dielectric material. For example, in an embodiment the second chip protection layer 234 may include silicon oxide (SiO).

The semiconductor chip 200 may be mounted on the substrate 100. As shown in FIG. 8, the front surface of the semiconductor chip 200 may be directed towards the substrate 100, and the semiconductor chip 200 may be electrically connected to the substrate 100. In this embodiment, the front surface of the semiconductor chip 200, or a bottom surface of the first chip wiring layer 220, may be in contact with a top surface of the substrate 100. For example, the first chip protection layer 224 may be in direct contact with the substrate protection layer 124 of the substrate 100. The first chip pads 222 of the semiconductor chip 200 may be disposed to correspond to the first substrate pads 122 of the substrate 100. Identically or similarly to that discussed in FIGS. 1, 2, 3, 4, 5, 6 and 7, the first chip pads 222 of the semiconductor chip 200 and the first substrate pads 122 of the substrate 100 may be bonded through interfacial layers 250 between the first chip pads 222 and the first substrate pads 122. The interfacial layers 250 may be disposed in spaces defined by recesses formed on the first substrate pads 122 and recesses formed on the first chip pads 222. The interfacial layers 250 may be in direct contact with the top surfaces of the first substrate pads 122 and with the bottom surfaces of the first chip pads 222. The bottom surfaces of the interfacial layers 250 may be located at a lower level than that of the top surface of the substrate protection layer 124, and may also have top surfaces located at a higher level than that of the bottom surface of the first chip protection layer 224. For example, an interface between the semiconductor chip 200 and the substrate 100 may be located at a level between the top and bottom surfaces of the interfacial layers 250.

In an embodiment, the semiconductor chip 200 may be provided in plural. For example, another semiconductor chip 200 may be mounted on one semiconductor chip 200. The front surface of the another semiconductor chip 200 may be directed towards the one semiconductor chip 200. In this embodiment, the front surface of the another semiconductor chip 200 may be in direct contact with the rear surface of the one semiconductor chip 200. For example, the first chip wiring layer 220 of the another semiconductor chip 200 may be in direct contact with the second chip wiring layer 230 of the one semiconductor chip 200. For example, the semiconductor chips 200 may be stacked to allow the first chip protection layer 224 and the second chip protection layer 234 to directly contact each other.

The first chip pads 222 of the semiconductor chip 200 may be disposed to correspond to the second chip pads 232 of another semiconductor chip 200 that overlies the first chip pads 222 of the semiconductor chip 200. Identically or similarly to that discussed with reference to FIGS. 1, 3, 4, 5, 6 7, the first chip pads 222 and the second chip pads 232 of adjacent semiconductor chips 200 may be bonded through the interfacial layers 250 between the first and second chip pads 222 and 232. The interfacial layers 250 may be disposed in spaces defined by recesses formed on the first chip pads 222 and recesses formed on the second chip pads 232. The interfacial layers 250 may be in direct contact with the bottom surfaces of the first chip pads 222 and with the top surfaces of the second chip pads 232. In an embodiment, an interface between the semiconductor chips 200 may be located at a level between the top and bottom surfaces of the interfacial layers 250. The semiconductor chips 200 may be electrically connected through the first chip pads 222 and the second chip pads 232. As described above, a plurality of semiconductor chips 200 and 200' may be stacked on the substrate 100. While an embodiment shown in FIG. 8 includes four semiconductor chips 200, 200', embodiments of the present inventive concept are not necessarily limited thereto and the number of the semiconductor chips 200, 200' may vary.

An uppermost semiconductor chip 200' of the semiconductor chips 200 and 200' included in the chip stack CS may have a configuration partially different from those of remaining semiconductor chips 200. For example, the uppermost semiconductor chip 200' may have neither the second chip wiring layer 230 nor the through electrodes 240.

A molding layer 300 may be disposed on the substrate 100. In an embodiment, the molding layer 300 may cover the top surface of the substrate 100. The molding layer 300 may surround the chip stack CS. For example, the molding layer 300 may cover lateral surfaces of the semiconductor chips 200 and 200'. The molding layer 300 may protect the chip stack CS. The molding layer 300 may include a dielectric material. For example, in an embodiment the molding layer 300 may include an epoxy molding compound (EMC), Differently from that shown in FIG. 8, in an embodiment the molding layer 300 may be formed to cover the chip stack CS. For example, the molding layer 300 may cover a rear surface of the uppermost semiconductor chip 200'.

It is illustrated in FIG. 8 that the semiconductor chips 200 are mounted on the substrate 100. However, embodiments of the present inventive concept are not necessarily limited thereto. According to some embodiments, the semiconductor chips 200 may be mounted on a base semiconductor chip. The base semiconductor chip may be a wafer-level semiconductor substrate formed of a silicon semiconductor. The base semiconductor chip may include an integrated circuit. For example, the integrated circuit may include a memory circuit, a logic circuit, or a combination thereof.

Figure 9:
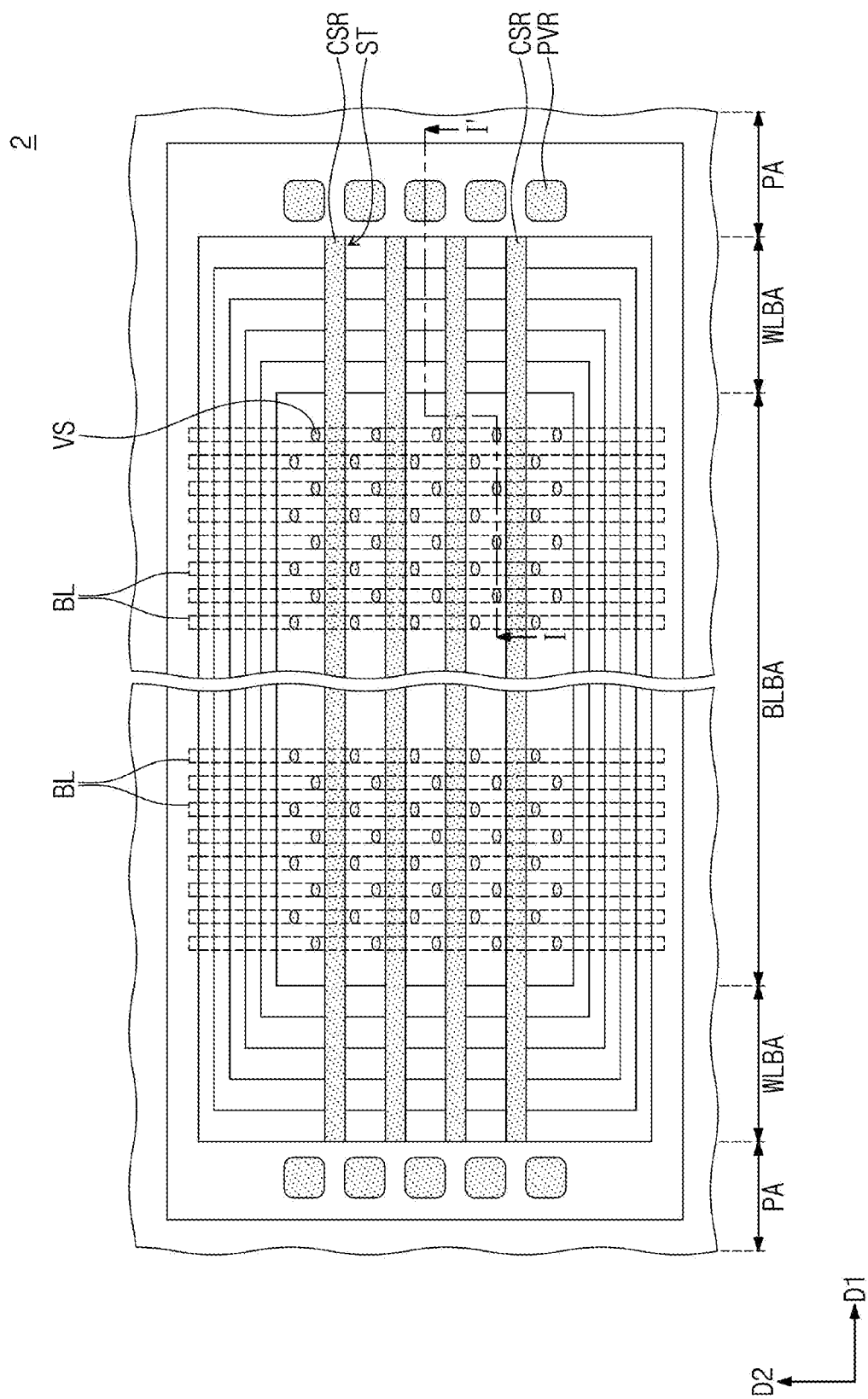
FIG. 9 illustrates a plan view showing a semiconductor device according to some embodiments of the present inventive concept.
Figure 10:
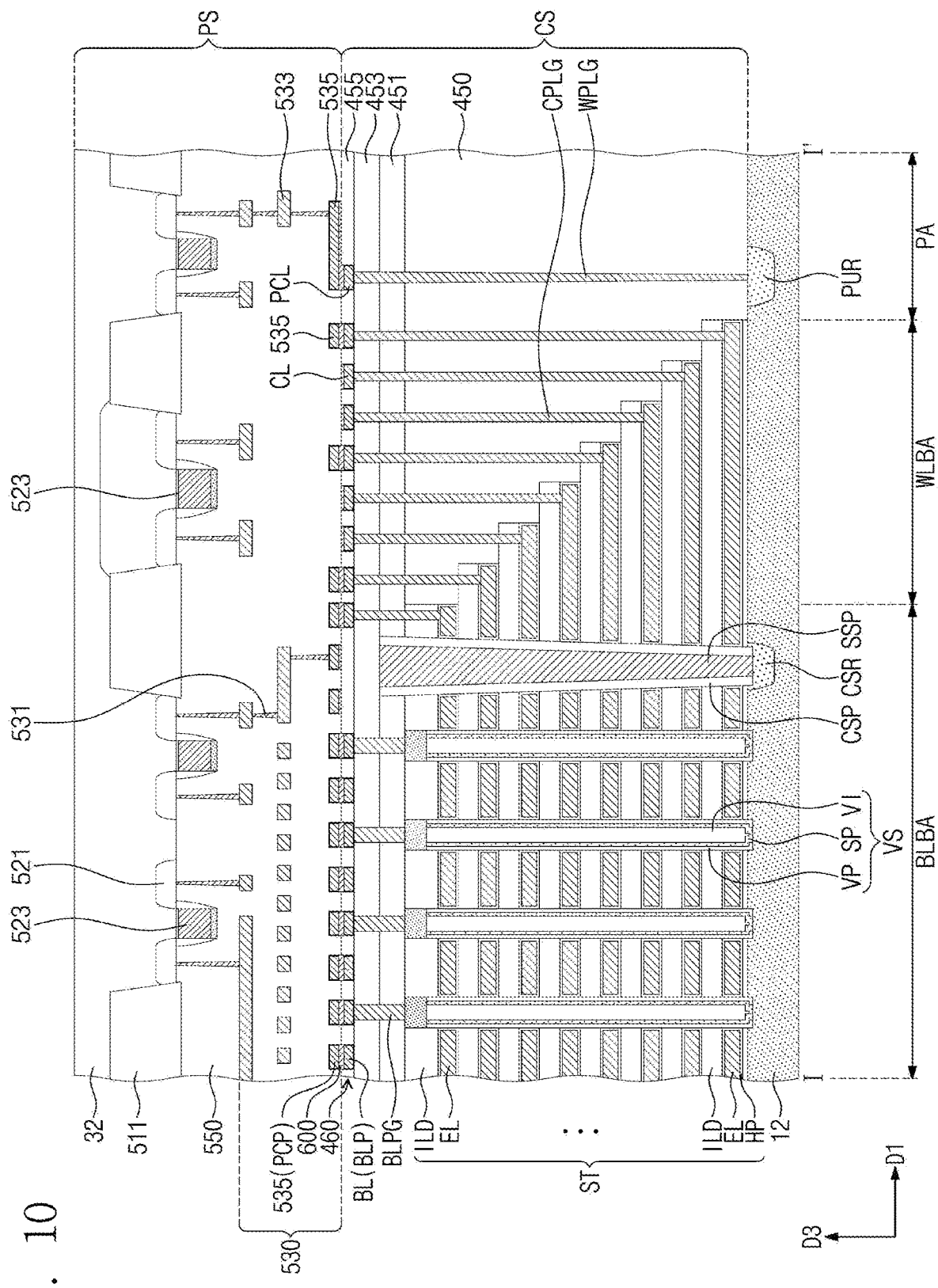
FIG. 10 illustrates a cross-sectional view showing a semiconductor device according to some embodiments of the present inventive concept.

FIG. 9 illustrates a plan view showing a semiconductor device according to some embodiments of the present inventive concept. FIG. 10 illustrates a cross-sectional view taken along line I-I' of FIG. 9, showing a semiconductor device 2 according to some embodiments of the present inventive concept.

Referring to FIGS. 9 and 10, the semiconductor device 2 may be a memory device. The semiconductor device 2 may have a chip-to-chip (C2C) structure. The chip-to-chip (C2C) structure may be fabricated by forming on a first wafer an upper chip including a cell array structure CAS; forming, on a second wafer different from the first wafer, a lower chip including a peripheral circuit structure PS, and then using a bonding method to connect the upper and lower chips to each other. For example, the bonding method may include electrically connecting a bonding metal formed on an uppermost metal layer of the upper chip to a bonding metal formed on an uppermost metal layer of the lower chip.

Each of the cell array structure CAS and the peripheral circuit structure PS of the semiconductor device 2 may include an external pad bonding area PA, a word-line bonding area WLBA, and a bit-line bonding area BLBA.

The semiconductor device 2 includes a first substrate 12. In an embodiment, the first substrate 12 may be formed of a semiconductor material, and may be a silicon (Si) substrate, a silicon-germanium (SiGe) substrate, a germanium (Ge) substrate, or a monocrystalline epitaxial layer grown on a monocrystalline silicon substrate, For example, the first substrate 12 may be a silicon substrate. In addition, the first substrate 12 may include a semiconductor doped with impurities having a first conductivity type (e.g., p-type) and/or an intrinsic semiconductor doped with no impurity.

According to some embodiments, the cell array structure CAS may be disposed on the first substrate 12, and may include stack structures ST, vertical structures VS, and connection structures CPLG, CL, WPLG, and PCL. For example, the first substrate 12 and the cell array structure CAS may correspond to the lower structure 10 discussed with reference to FIG. 1, and a portion of the cell array structure CAS may correspond to the first circuit layer 14 discussed with reference to FIG. 1.

On the first substrate 12, the stack structures ST may extend lengthwise in parallel in a first direction D1 and may be arranged spaced apart from each other in a second direction D2. Each of the stack structures ST may include electrodes EL vertically stacked on the first substrate 12 and dielectric layers ILD interposed between the electrodes EL. The dielectric layers ILD of the stack structures ST may have thicknesses that can be changed depending on properties of a semiconductor memory device. For example, in some embodiments one or more of the dielectric layers ILD may be formed thicker than others of the dielectric layers ILD. In an embodiment, the dielectric layers ILD may include silicon oxide (SiO). In an embodiment, the electrodes EL may include a conductive material including, for example, a semiconductor layer, a metal silicon layer, a metal layer, a metal nitride layer, or a combination thereof.

The stack structures ST may extend along the first direction D1 from the bit-line bonding area BLBA to the word-line bonding area WLBA, and may have a stepwise structure on the word-line bonding area WLBA. For example, the electrodes EL of the stack structures ST may have lengths in the first direction D1 that decrease with increasing distance from the first substrate 12. The stack structures ST may have variously shaped stepwise structures on the word-line bonding area WLBA.

In some embodiments, the semiconductor device 2 may be a three-dimensional NAND Flash memory device, and cell strings may be integrated on the first substrate 12. In this embodiment, the stack structures ST may be configured such that uppermost and lowermost electrodes EL may be used as gate electrodes of selection transistors. For example, the topmost electrode EL may serve as a gate electrode of a string selection transistor that controls an electrical connection between a bit line BL and the vertical structures VS, and the bottommost electrode EL may serve as a gate electrode of a ground selection transistor that controls an electrical connection between a common source line and the vertical structures VS. Other electrodes EL between the uppermost and lowermost electrodes EL may serve as control gate electrodes of memory cells and as word lines that connect the control gate electrodes to each other.

On the bit-line bonding area BLBA, the vertical structures VS may penetrate the stack structures ST to come into direct contact with the first substrate 12. The vertical structures VS may be electrically connected to the first substrate 12. In an embodiment, when viewed in a plan view, the vertical structures VS may be arranged in a straight or zigzag fashion along one direction. In addition, in an embodiment on the word-line bonding area WLBA or the external pad bonding area. PA, dummy vertical structures may be disposed which have substantially the same structure as that of the vertical structures VS.

In an embodiment, the vertical structures VS may include a semiconductor material, such as silicon (Si), germanium (Ge), or a mixture thereof. Additionally or alternatively, the vertical structures VS may include an impurity-doped semiconductor or an impurity-undoped intrinsic semiconductor. The vertical structures VS including a semiconductor material may be used as channels of selection transistors and channels of memory cell transistors. The vertical structures VS may have their bottom surfaces between top and bottom surfaces of the first substrate 12. The vertical structures VS may each have, on its upper end, a contact pad coupled to a bit-line contact plug BPLG.

Each of the vertical structures VS may include a vertical dielectric pattern VP and a semiconductor pattern SP in direct contact with the first substrate 12. In an embodiment, the semiconductor pattern SP may have a hollow pipe shape or a macaroni shape. The semiconductor pattern SP may have a closed shape at a bottom end thereof, and a buried dielectric pattern VI may fill an inside of the semiconductor pattern SP. The semiconductor pattern SP may be in direct contact with the top surface of the first substrate 12. In an embodiment, the semiconductor pattern SP may be undoped or doped with impurities having a conductivity type is the same as that of the first substrate 12. In an embodiment, the semiconductor pattern SP may be polycrystalline or monocrystalline.

The vertical dielectric pattern VP may be disposed between the stack structure ST and the vertical structure VS. The vertical dielectric pattern VP may extend in a third direction D3 and may surround a sidewall of the vertical structure VS. For example, in an embodiment the vertical dielectric pattern VP may have a macaroni shape or a pipe shape having top and bottom ends that are open. The vertical dielectric pattern VP may be formed of a single thin layer or a plurality of thin layers. In some embodiments of the present inventive concept, the vertical dielectric pattern VP may be a portion of a data storage layer. For example, the vertical dielectric pattern VP may include a tunnel dielectric layer, a charge storage layer, and a blocking dielectric layer. These layers may constitute a data storage layer of a NAND Flash memory device. For example, the charge storage layer may be a trap dielectric layer, a floating gate electrode, or a dielectric layer including conductive nano-dots. In an embodiment, the charge storage layer may include at least one compound selected from silicon nitride (SiN) silicon oxynitride (SiON), silicon-rich nitride, nano-crystalline silicon, and a laminated trap layer. The tunnel dielectric layer may be one of materials having a band gap that is greater than that of the charge storage layer, and the blocking dielectric layer may be a high-k dielectric layer such as aluminum oxide ($Al_2O_3$) and hafnium oxide ($Hf_2O$). Alternatively, the vertical dielectric pattern VP may include a thin layer either for a phase change memory device or for a variable resistance memory device.

The first substrate 12 may have common source regions CSR disposed therein between neighboring stack structures ST. The common source regions CSR may extend lengthwise in the first direction D1 parallel to the stack structures ST. In an embodiment, the common source regions CSR may be formed by doping the first substrate 12 with impurities having a second conductivity type. In an embodiment, the common source regions CSR may include, for example, n-type impurities (e.g., arsenic (As) or phosphorous (P)).

A common source plug CSP may be coupled to the common source region CSR. A sidewall dielectric spacer SSP may be interposed between the common source plug CSP and the stack structures ST. In a read or program mode of a three-dimensional NAND Flash memory device, a ground voltage may be applied through the common source plug CSP to the common source region CSR.

A first buried dielectric layer 450 may be disposed on the first substrate 12 and may cover stepwise ends of the electrodes EL. A first interlayer dielectric layer 451 may cover top surfaces of the vertical structures VS, and the first interlayer dielectric layer 451 may be disposed thereon with a second interlayer dielectric layer 453 that covers a top surface of the common source plug CSP.

Bit lines BL that extend lengthwise in the second direction D2 and run across the stack structures ST may be disposed on the second interlayer dielectric layer 453. Each of the bit lines BL may be electrically connected through the bit-line contact plug BPLG to the vertical structure VS. The bit lines BL may correspond to pads for electrical connection with the peripheral circuit structure PS which will be discussed. The bit lines BL may have bit-line pads BLP. The bit-line pads BLP may be the same as or similar to the first pads 20 discussed with reference to FIGS. 1, 2, 3, 4 5. For example, top surfaces of the bit-line pads BLP may be located at a lower level than that of a top surface of a third interlayer dielectric layer 455 which will be discussed below. In such a configuration, bit-line pads BLP may include recesses that are defined by the bit-line pads BLP and the third interlayer dielectric layer 455.

A connection line structure that electrically connects the cell array structure CAS to the peripheral logic structure PS may be disposed on the stepwise shaped ends of the stack structures ST. The connection line structure may include cell contact lugs CPLG that penetrate the first buried dielectric layer 450 and the first and second interlayer dielectric layers 451 and 453 to come into connection with (e.g., directly contact) corresponding ends of the electrodes EL, and may also include connection lines CL that are disposed on the second interlayer dielectric layer 453 to come into connection with (e.g., directly contact) corresponding cell contact plugs CPLG. In addition, the connection line structure may include well contact plugs WPLG coupled to well pickup regions PUR in the external pad bonding area PA of the first substrate 12, and may also include peripheral connection lines PCL connected to the well contact plugs WPLG. The bit lines BL, the connection lines CL, and the peripheral connection lines PCL may constitute a cell array wiring layer 460.

The first substrate 12 may have therein the well pickup regions PUR that are disposed adjacent to opposite ends of each of the stack structures ST. In an embodiment, the well pickup regions PUR may have the same conductivity type as that of the first substrate 12 and, an impurity concentration of the well pickup regions PUR may be greater than that of the first substrate 12. For example, in an embodiment the well pickup regions PUR may include heavily doped p-type impurities (e.g., boron (B)). According to some embodiments, in an erase operation of a three-dimensional NAND Flash memory device, an erase voltage may be applied to the well pickup regions PUR through the connection contact plugs PPLG and the well contact plugs WPLG.

A third interlayer dielectric layer 455 that surrounds the bit lines BL, the connection lines CL, and the peripheral connection lines PCL may be disposed on the second interlayer dielectric layer 453. The third interlayer dielectric layer 455 may expose top surfaces of the bit-line pads BLP, top surfaces of the connection lines CL, and top surfaces of the peripheral connection lines PCL. The third interlayer dielectric layer 455 may be the same as or similar to the first dielectric layer 16 discussed with reference to FIGS. 1, 2, 3, 4, 5, 6 and 7. The bit lines BL, the connection lines CL, and the peripheral connection lines PCL may constitute the cell array wiring layer 460. The bit lines BL, the connection lines CL, and the peripheral connection lines PCL may correspond to pads of the cell array structure CAS electrically connected to the peripheral circuit structure PS which will be discussed below.

As described above, the cell array structure CAS may be disposed on the first substrate 12. The peripheral circuit structure PS may be disposed on the cell array structure CAS.

The semiconductor device 2 may include a second substrate 32. In an embodiment, the second substrate 32 may be a silicon substrate, a silicon-germanium substrate, a germanium substrate, or a monocrystalline epitaxial layer grown on a monocrystalline silicon substrate. For example, the second substrate 32 may be a silicon substrate having a first conductivity type (e.g., p-type), and may include well regions.

The peripheral logic structure PS may include peripheral circuits that are integrated on a front surface of the second substrate 32 and a second buried dielectric layer 550 that covers the peripheral circuits. For example, the second substrate 32 and the peripheral circuit structure PS may correspond to the upper structure 30 discussed with reference to FIG. 1, and a portion of the peripheral circuit structure PS may correspond to the second circuit layer 34 discussed with reference to FIG. 1.

In an embodiment, the peripheral circuits may be row and column decoders, a page buffer, and a control circuit, and may include NMOS and PMOS transistors, low-voltage and high-voltage transistors, and a resistor that are integrated on one surface of the second substrate 32. For example, the peripheral circuits may include a free charge control circuit that controls a plurality of data program steps for a plurality of memory cells and that controls one or more of a plurality of cell strings. For example, a device isolation layer 511 that defines active regions may be disposed on the second substrate 32. Peripheral gate electrodes 523 may be disposed on the active region of the second substrate 32. Gate dielectric layers may be interposed between the peripheral gate electrodes 523 and the second substrate 32. The second substrate 32 may include source/drain regions 521 positioned on opposite sides of the peripheral gate electrode 523.

A peripheral circuit wiring layer 530 may be connected to the peripheral circuits on the second substrate 32. The peripheral circuit wiring layer 530 may include peripheral circuit wiring lines 533 and peripheral circuit contact plugs 531. The peripheral circuit wiring lines 533 may be electrically connected through the peripheral circuit contact plugs 531 to the peripheral circuits. For example, the peripheral circuit contact plugs 531 and the peripheral circuit wiring lines 533 may be coupled to the NMOS and PMOS transistors.

The second buried dielectric layer 550 may cover the peripheral gate electrodes 523, the peripheral circuit contact plugs 531, and the peripheral circuit wiring lines 533. The peripheral circuit wiring layer 530 may further include exposure wiring lines 535 that are exposed on a bottom surface of the second buried dielectric layer 550. The exposure wiring lines 535 may correspond to pads for electrically connecting the peripheral circuit structures PS to the cell array structure CAS. The exposure wiring lines 535 may have peripheral circuit pads PCP. The peripheral circuit pads PCP may be the same as or similar to the second pads 40 discussed with reference to FIGS. 1, 2, 3, 4 and 5. For example, the peripheral circuit pads PCP may have widths less than those of the bit-line pads BLP, and thicknesses greater than those of the bit-line pad BLP. For example, the peripheral circuit pads PCP may have bottom surfaces at a higher level than that of the bottom surface of the second buried dielectric layer 550. The peripheral circuit pads PCP may include recesses that are defined by the peripheral circuit pads PCP and the second buried dielectric layer 550. The second buried dielectric layer 550 may include a plurality of stacked dielectric layers. For example, the second buried dielectric layer 550 may include one or more compounds selected from silicon oxide (SiO), silicon nitride (SiN), silicon oxynitride (SiON), and a low-k dielectric material. For example, in an embodiment the peripheral circuit wiring lines 533 and the peripheral circuit contact plugs 531 may be formed of tungsten having a resistance that is relatively higher, and the exposure wiring lines 535 may be formed of cupper whose resistance is relatively lower.

The peripheral circuit wiring lines 533 of a single layer are illustrated and explained in this description. However, embodiments of the present inventive concept are not necessarily limited thereto. For example, in an embodiment the peripheral circuit wiring lines 533 may be provided in a plurality of layers, and the peripheral circuit wiring lines 533 in one layer may be stacked on the peripheral circuit wiring lines 533 in another layer. In this embodiment, one or more of the peripheral circuit wiring lines 533 may be formed of aluminum having a resistance that is less than that of copper of which the exposure wiring lines 535 are formed.

The cell array structure CAS and the peripheral circuit structure PS may be in direct contact with each other. For example, as shown in FIG. 10, the cell array wiring layer 460 of the cell array structure CAS may be in direct contact with the peripheral circuit wiring layer 530 of the peripheral circuit structure PS. For example, the third interlayer dielectric layer 455 may be in direct contact with the second buried dielectric layer 550, and the exposure wiring lines 535 may be connected to one or more of the peripheral connection lines PCL, the connection lines CL, and the bit lines BL. The bit-line pads BLP and the peripheral circuit pads PCP may be in contact through interfacial layers 600 disposed between the bit-line pads BLP and the peripheral circuit pads PCP. The interfacial layers 600 may be provided in spaces defined by recesses formed on the bit-line pads BLP and recesses formed on the peripheral circuit pads PCP. The interfacial layers 600 may be in direct contact with the top surfaces of the bit-line pads BLP and with the bottom surfaces of the peripheral circuit pads PCP. An interface between the cell array structure CAS and the peripheral circuit structure PS may be located at a level between top and bottom surfaces of the interfacial layers 600. The cell array structure CAS and the peripheral circuit structure PS may be electrically connected through the bit-line pads BLP and the peripheral circuit pads PCP.

FIGS. 11, 12, 13, 14, 15, 16, 17, 18, 19, 20, 21, 22, 23, 24 and 25 illustrate cross-sectional views showing a method of fabricating a semiconductor device according to some embodiments of the present inventive concept. FIGS. 11, 12, 13, 14, 15, 16, 17, 19, 21, 23, and 25 are cross-sectional views. FIGS. 18, 20, 22, and 24 are cross-sectional views of section C depicted in FIGS. 17, 19, 21, and 23.

Figure 11:
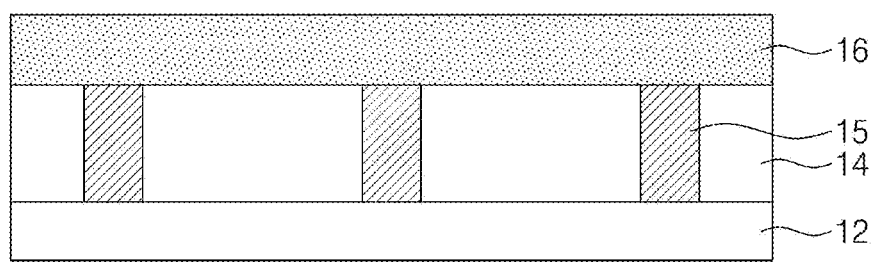
FIGS. 11, 12, 13, 14, 15, 16, 17, 18, 19, 20, 21, 22, 23, 24, 25 and 26 illustrate cross-sectional views showing a method of fabricating a semiconductor device according to some embodiments of the present inventive concept.

Referring to FIG. 11, a first substrate 12 may be provided. The first substrate 12 may be a semiconductor substrate. A first circuit layer 14 may be formed on the first substrate 12. The first circuit layer 14 may have a first connection line 15 for connecting the first substrate 12 to first pads (see 20 of FIG. 18). A dielectric material may be deposited to form a first dielectric layer 16 on the first circuit layer 14.

Figure 12:
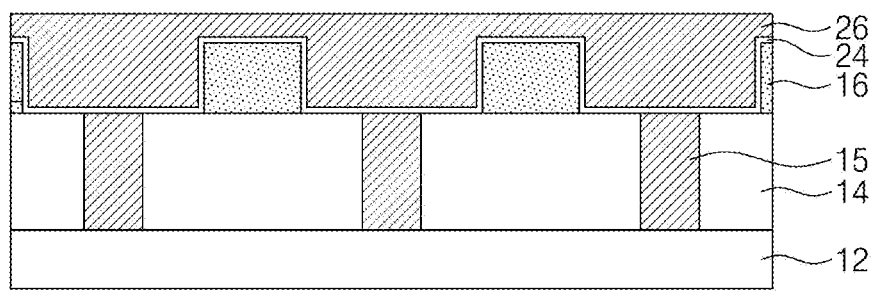

Referring to FIG. 12, the first dielectric layer 16 may be patterned to form holes in which first pads (see 20 of FIG. 13) are provided. A first seed/barrier layer 24 may be formed on the first dielectric layer 16. The first seed/barrier layer 24 may be formed to conformally cover the first dielectric layer 16. For example, the first seed/barrier layer 24 may cover a top surface of the first dielectric layer 16 and may also cover bottom and inner lateral surfaces of the holes.

A first conductive layer 26 may be formed on the first dielectric layer 16 and may fill the holes. In an embodiment, the formation of the first conductive layer 26 may include a plating process in which the first seed/barrier layer 24 is used as a seed. In an embodiment, the first conductive layer 26 may include a metallic material, such as copper (Cu). The first conductive layer 26 may cover the top surface of the first dielectric layer 16.

Figure 13:
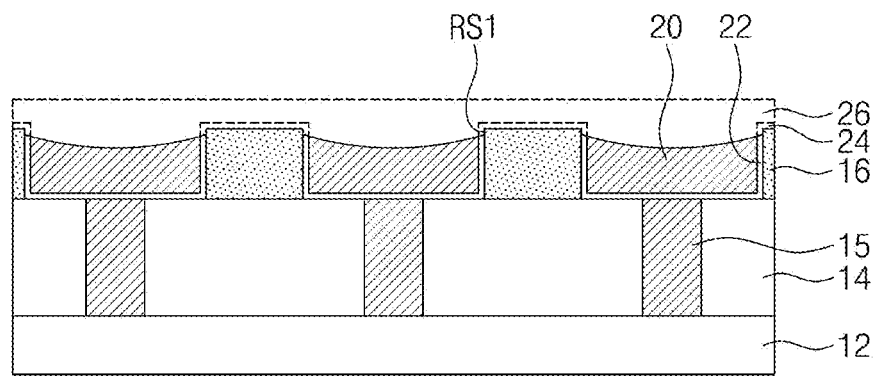

Referring to FIG. 13, a first planarization process may be performed on the first conductive layer 26. In an embodiment, the first planarization process may include a chemical mechanical polishing (CMP) process. The first planarization process may form first pads 20 and first seed/barrier patterns 22 in the holes. For example, the first conductive layer 26 and the first seed/barrier layer 24 may be partially removed from the top surface of the first dielectric layer 16, and the top surface of the first dielectric layer 16 may be exposed. The first conductive layer 26 may be over-etched during the first planarization process. For example, after the first planarization process, top surfaces of the first pads 20 may be located at a lower level than that of the top surface of the first dielectric layer 16. Therefore, the first pads 20 may be provided thereon with first recesses RS1 that are defined by the first pads 20 and the first dielectric layer 16. The first recesses RS1 may have bottom surfaces having a concave shape in a direction towards the first substrate 12. However, embodiments of the present inventive concept are not necessarily limited thereto, and the bottom surfaces of the first recesses RS1 may be parallel to a top surface of the first substrate 12.

Figure 14:
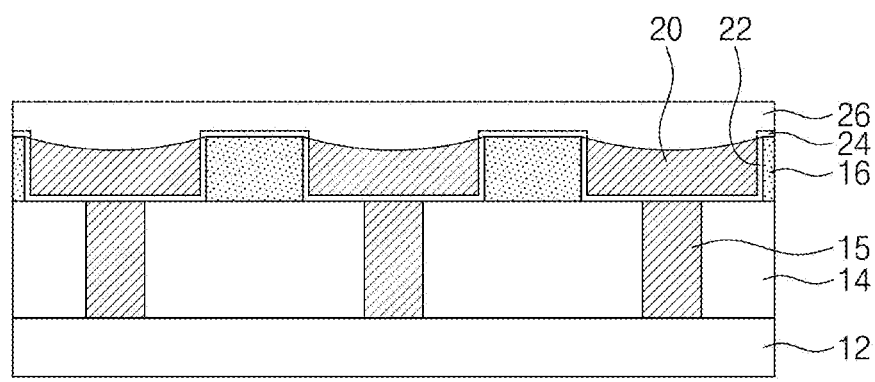

According to some embodiments, as shown in FIG. 14, after the first planarization process, uppermost ends of the first pads 20 may be located at the same level as that of the top surface of the first dielectric layer 16. The top surfaces of the first pads 20 may have concave shapes in a direction towards the first substrate 12. However, embodiments of the present inventive concept are not necessarily limited thereto, and an entirety of the top surfaces of the first pads 20 may be coplanar with that of the first dielectric layer 16 in some embodiments.

Figure 15:
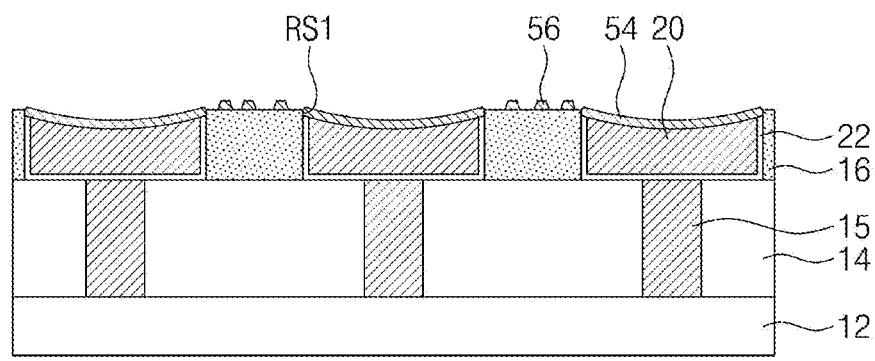

Referring to FIG. 15, first surface layers 54 may be formed on the first pads 20. The first surface layers 54 may fill upper portions of the first recesses RS1. The first surface layers 54 may be formed to conformally cover the top surfaces of the first pads 20, and in accordance with shapes of the bottom surfaces of the first recesses RS1 and thicknesses of the first surface layers 54, portions of the upper portions of the first recesses RS1 may not be filled. In an embodiment, the first surface layers 54 may be formed of the same material as that of the first pads 20. For example, the first surface layers 54 may include a metallic material, such as copper (Cu).

In an embodiment, a sputtering process may be used to form the first surface layers 54. The sputtering process may deposit the metallic material on the first pads 20. In this step, a portion of the metallic material may also be deposited on the top surface of the first dielectric layer 16. In an embodiment in which the metallic material used in the sputtering process is the same as a material included in the first pads 20, the metallic material may be deposited as thin films on the first pads 20. In an embodiment in which the metallic material used in the sputtering process is different from a material included in the first dielectric layer 16, the metallic material may be difficult to deposit on the first dielectric layer 16. Therefore, the first dielectric layer 16 may be provided thereon with islands 56 that are formed of the metallic material. Alternatively, the metallic material may not be deposited on the first dielectric layer 16.

In an embodiment in which the first surface layers 54 and the first pads 20 are formed by using different processes, the first surface layers 54 and the first pads 20 may have different crystalline properties even when the first surface layers 54 and the first pads 20 are formed of the same material. For example, an average grain size of the first surface layers 54 formed by a sputtering process may be less than that of the first pads 20 formed by a plating process.

Figure 16:
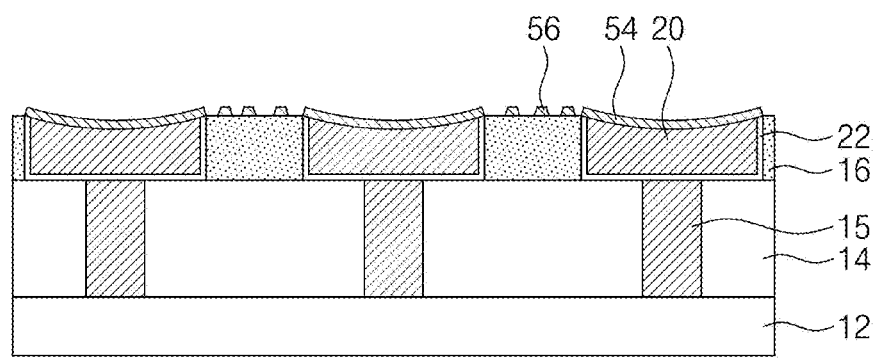

According to some embodiments, as shown in FIG. 16, the first surface layers 54 may be formed on the first pads 20 in a resultant structure of FIG. 14. The first surface layers 54 may fill entire upper portions of the first recesses RS1.

Figure 17:
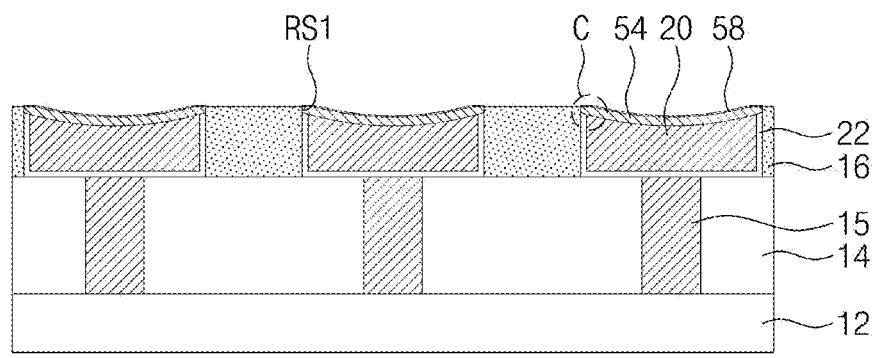
Figure 18:
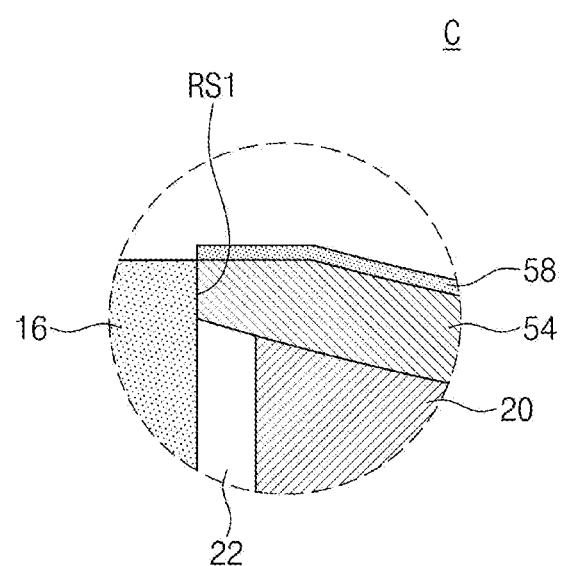

Referring to FIGS. 17 and 18, a second planarization process may be performed on the first dielectric layer 16 and the first surface layers 54. In an embodiment, the second planarization process may include a buffing process. The second planarization process may remove the islands 56 on the first dielectric layer 16. In addition, the first surface layers 54 located at a higher level than that of the top surface of the first dielectric layer 16 may also be removed. As the buffing process having a low grinding force is performed as the second planarization process, neither the first surface layers 54 nor the first pads 20 may be over-etched. For example, neither the first pads 20 nor the first surface layers 54 positioned in the first recesses RS1 may be partially etched.

In the second planarization process, an oxide layer 58 may be formed on the first surface layers 54. For example, upper portions of the first surface layers 54 may be oxidized due to an abrasive used in the second planarization process or heat generated in the second planarization process. In an embodiment, the oxide layer 58 may include oxide of a metallic material included in the first surface layers 54. For example, the oxide layer 58 may include copper oxide (CuO).

Figure 19:
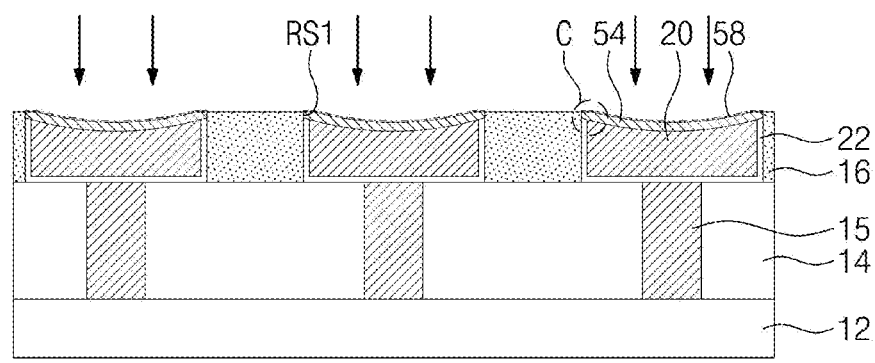
Figure 20:
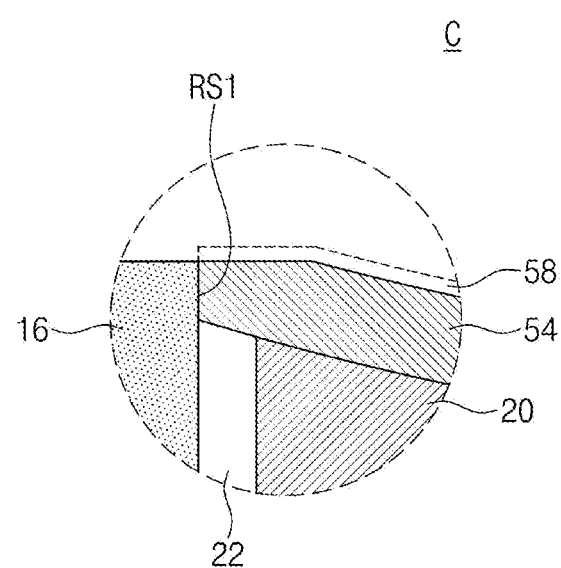

Referring to FIGS. 19 and 20, a first surface treatment process may be performed on the first dielectric layer 16 and the first surface layers 54. In an embodiment, the first surface treatment process may include argon (Ar) plasma treatment process. The first surface treatment process may remove the oxide layer 58. Accordingly, top surfaces of the first surface layers 54 may be exposed.

Figure 21:
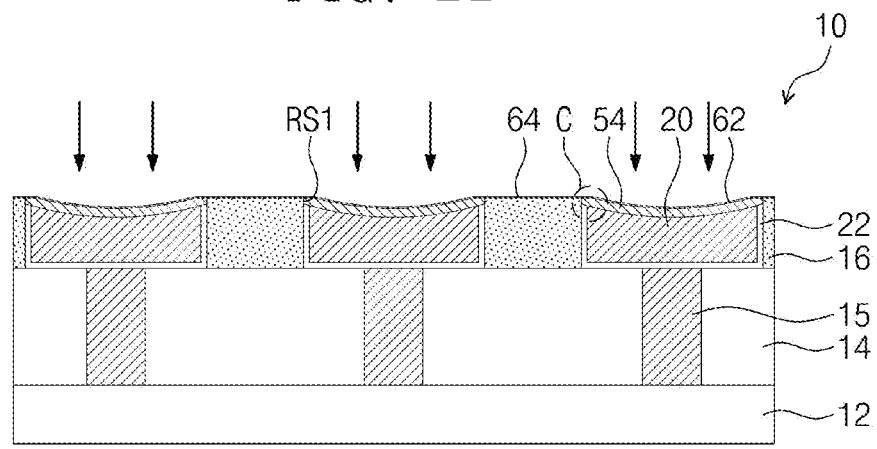
Figure 22:
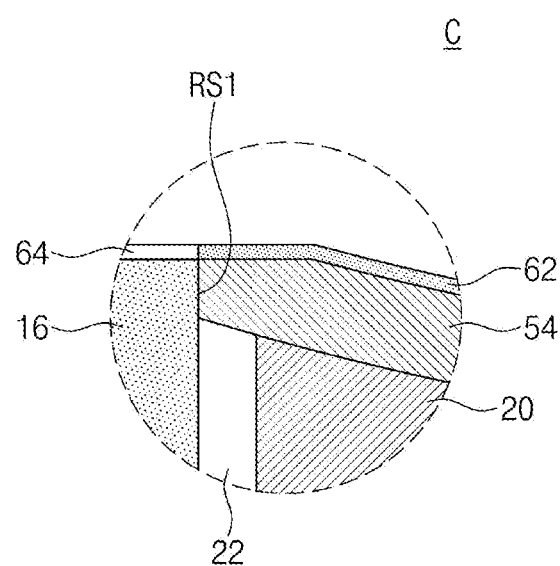

Referring to FIGS. 21 and 22, a second surface treatment process may be performed on the first dielectric layer 16 and the first surface layers 54. In an embodiment, the second surface treatment process may include nitrogen (N) plasma treatment process. The second surface treatment process may be performed separately from the first surface treatment process. For example, the second surface treatment process may be executed after the first surface treatment process is completed. After the nitrogen plasma treatment process is performed, a first metal nitride layer 62 may be formed on the top surfaces of the first surface layers 54, and a first hydroxide layer 64 may be formed on the top surface of the first dielectric layer 16. For example, nitrogen plasma provided in the nitrogen plasma treatment may react with the top surfaces of the first surface layers 54, with the result that the first metal nitride layer 62 may be formed. The nitrogen plasma provided in the nitrogen plasma treatment process may react with the top surface of the first dielectric layer 16, with the result that the first hydroxide layer 64 may be formed. In an embodiment, the first metal nitride layer 62 may include copper nitride ($Cu_4N$). An average grain size of the first surface layers 54 formed by a sputtering process may be less than that of the first pads 20 formed by a plating process. Copper nitride ($Cu_4N$) may be more easily formed on the first surface layers 54 than on the first pads 20. In addition, copper nitride ($Cu_4N$) may be more easily formed than copper nitride ($Cu_3N$) on the first surface layers 54. Since nitrogen nitride ($Cu_4N$) is more chemically unstable than copper nitride ($Cu_3N$), the first metal nitride layer 62 formed of copper nitride ($Cu_4N$) may be easily removed in a subsequent process. The first metal nitride layer 62 may serve as an oxidation barrier layer for preventing oxidation of the first surface layers 54. The first hydroxide layer 64 may include silicon hydroxide (Si—OH).

A lower structure 10 may be fabricated as described above. An upper structure 30 may be fabricated identically or similarly to the lower structure 10.

Figure 23:
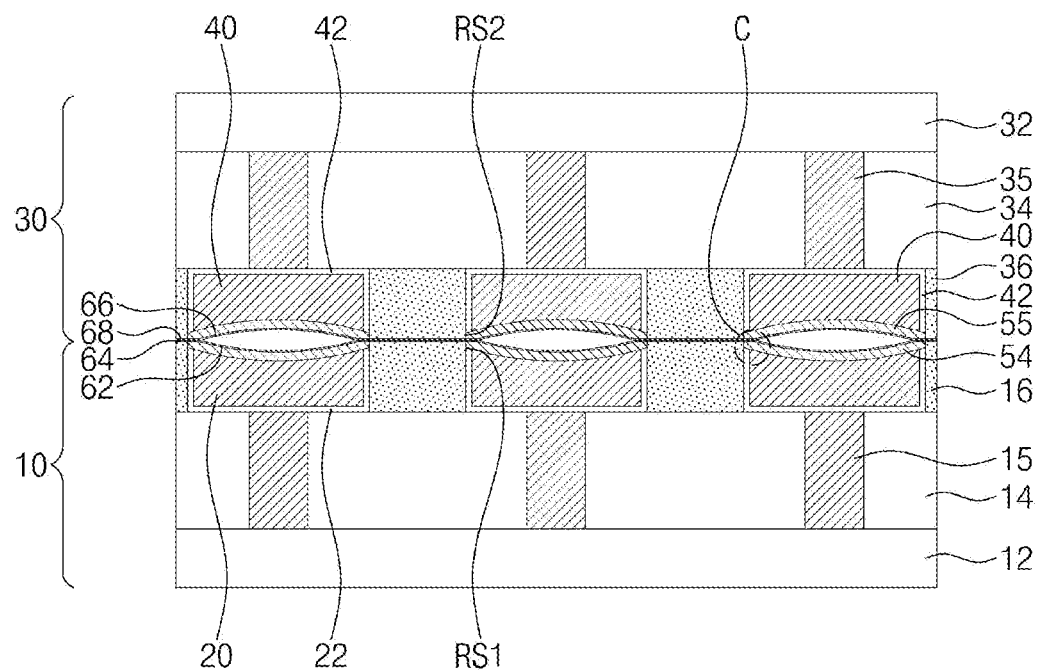
Figure 24:
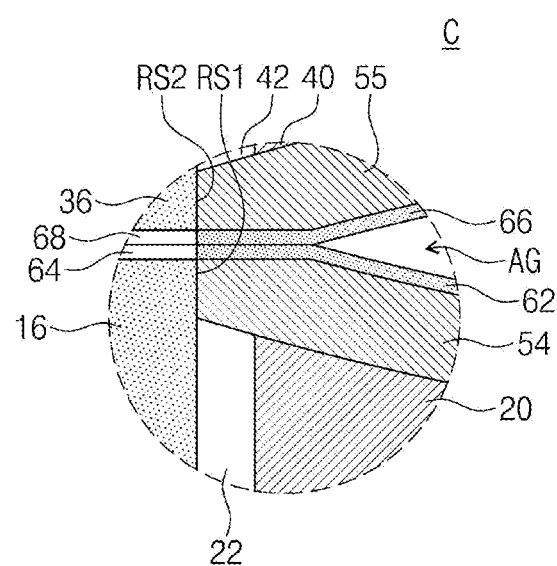

Referring to FIGS. 23 and 24, the upper structure 30 may be provided on the lower structure 10. For example, the upper structure 30 may be disposed on the lower structure 10 to allow the first pads 20 to vertically align with the second pads 40.

Afterwards, the lower structure 10 and the upper structure 30 may be in direct contact with each other. The top surface of the first dielectric layer 16 included in the lower structure 10 may be in direct contact with a bottom surface of a second dielectric layer 36 included in the upper structure 30. For example, the first hydroxide layer 64 on the first dielectric layer 16 may be in direct contact with a second hydroxide layer 68 on the second dielectric layer 36. The top surfaces of the first surface layers 54 included in the lower structure 10 may face bottom surfaces of second surface layers 55 included in the upper structure 30. In this step, based on shapes of the first recesses RS1 formed on the first pads 20 and shapes of second recesses RS2 formed on second pads 40, air gaps AG may be formed between the first surface layers 54 and the second surface layers 55. For example, the air gaps AG may be defined by the first metal nitride layers 62 on the first surface layers 54 and second metal nitride layers 66 on the second surface layers 55.

Figure 25:
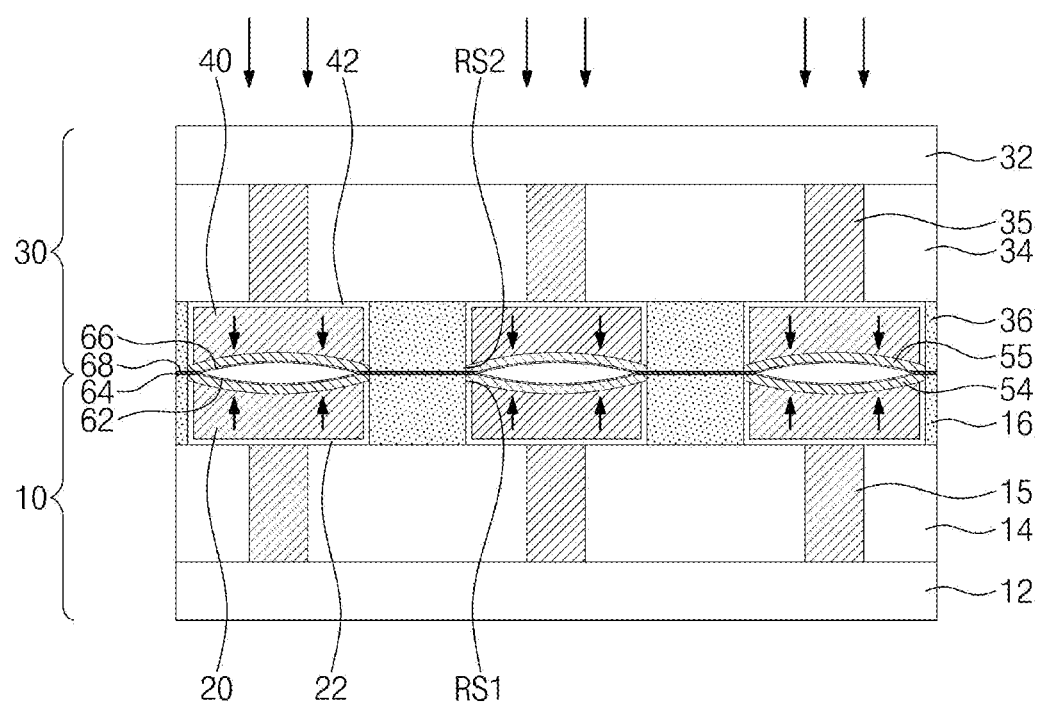

Referring to FIGS. 1 and 25, an annealing process may be performed on the lower structure 10 and the upper structure 30.

In the annealing process, the first surface layers 54 of the lower structure 10 and the second surface layers 55 of the upper structure 30 may be bonded to form interfacial layers 50. For example, the annealing process may expand the first pads 20 and the second pads 40. The top surfaces of the first pads 20 may move upwards, and bottom surfaces of the second pads 40 may move downwards. Therefore, the first surface layers 54 and the second surface layers 55 may be in direct contact with each other across the first metal nitride layer 62 and the second metal nitride layer 66, and the first recesses RS1 and the second recesses RS2 may be removed. The annealing process may remove nitrogen (N) elements from first metal nitride layer 62 and the second metal nitride layer 66, and the first metal nitride layer 62 and the second metal nitride layer 66 may become portions of the first surface layer 54 and the second surface layer 55, respectively. The first surface layer 54 and the second surface layer 55 may be combined into a single unitary body. The bonding between first surface layer 54 and the second surface layer 55 may be automatically performed. For example, the first surface layers 54 and the second surface layers 55 may be formed of the same material (e.g., copper (Cu)), and may be combined with each other by an intermetallic hybrid bonding process due to a surface activation at interfaces between the first surface layers 54 and the second surface layers 55 that are in direct contact with each other.

According to some embodiments of the present inventive concept, the bonding process of the lower structure 10 and the upper structure 30 may remove the first recesses RS1 that are formed by the first planarization process performed on the first pads 20. In addition, easily removable copper nitride ($Cu_4N$) may be used to form the first and second metal nitride layers 62 and 66 that serve as oxidation barrier layers. Therefore, neither empty spaces nor other material layers may remain between the first pads 20, the interfacial layers 50, and the second pads 40, and the first pads 20 and the second pads 40 may be easily connected to each other. As a result, a failure may be less likely to occur in fabricating a semiconductor device.

According to some embodiments, portions of nitrogen (N) elements that are removed from the first metal nitride layers 62 and the second metal nitride layers 66 may remain in the interfacial layers 50.

The annealing process may bond the first dielectric layer 16 of the lower structure 10 to the second dielectric layer 36 of the upper structure 30. For example, in the annealing process, a silicon oxide (SiO) layer may be formed from the first hydroxide layer 64 and the second hydroxide layer 68 that are in direct contact with each other. For example, during the annealing process, the first dielectric layer 16, the first hydroxide layer 64, the second hydroxide layer 68, and the second dielectric layer 36 may all include silicon oxide (SiO), and may be combined into a single unitary body.

Figure 26:
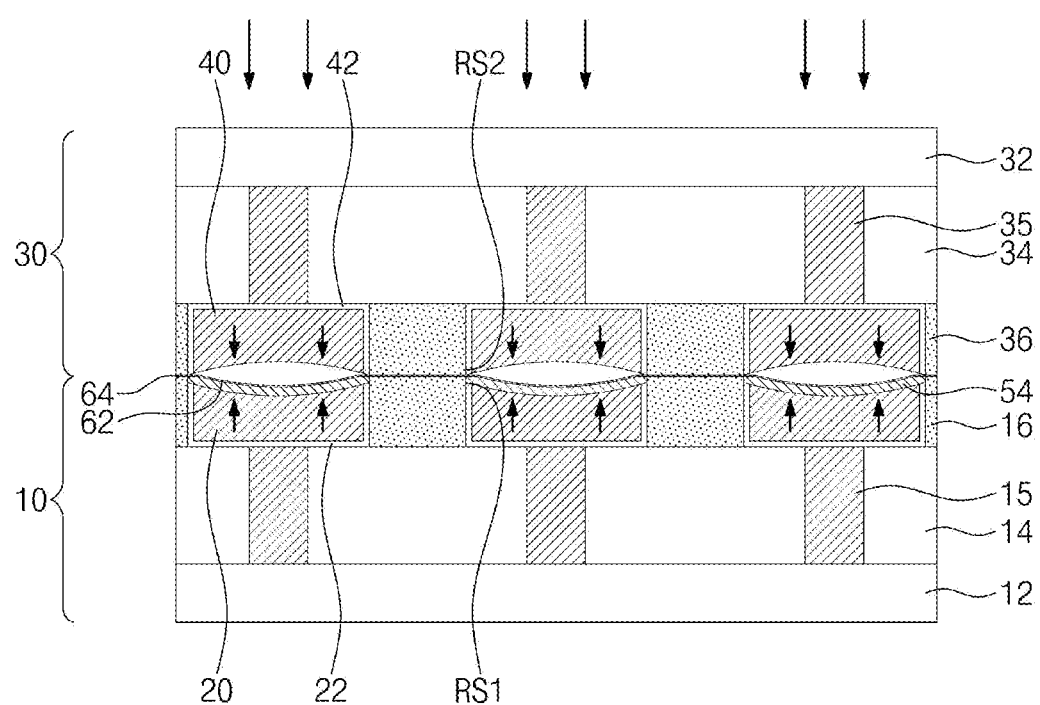

FIG. 26 illustrates a cross-sectional view showing a method of fabricating a semiconductor device according to some embodiments of the present inventive concept.

Referring to FIGS. 11, 12, 13, 14, 15, 16, 17, 18, 19, 21 and 22, the lower structure 10 may be fabricated. The fabrication of the upper structure 30 may be slightly different from the fabrication of the lower structure 10. For example, the upper structure 30 may be fabricated through the processes of FIGS. 11, 12, 13 and 14. For example, the second surface layers 55 may not be formed on the second pads 40 of the upper structure 30.

Referring back to FIG. 26, the upper structure 30 may be provided on the lower structure 10. For example, the upper structure 30 may be disposed on the lower structure 10 to allow the first pads 20 to vertically align with the second pads 40.

The lower structure 10 and the upper structure 30 may be in direct contact with each other. The top surface of the first dielectric layer 16 included in the lower structure 10 may be in direct contact with the bottom surface of the second dielectric layer 36 included in the upper structure 30. The top surfaces of the first surface layers 54 included in the lower structure 10 may face the bottom surfaces of the second pads 40 included in the upper structure 30. In this step, based on shapes of the first recesses RS1 formed on the first pads 20, the air gaps AG may be formed between the first surface layers 54 and the second surface layers 55. For example, the air gaps AG may be defined by the first metal nitride layers 62 on the first surface layers 54 and by the second pads 40.

An annealing process may be performed on the lower structure 10 and the upper structure 30.

The annealing process may cause the first surface layers 54 of the lower structure 10 to form the interfacial layers 50. For example, the annealing process may expand the first pads 20 and the second pads 40. The top surfaces of the first pads 20 may move upwards, and bottom surfaces of the second pads 40 may move downwards. Therefore, the first surface layers 54 may be in direct contact with the second pads 40, and the first recesses RS1 may be removed. In the annealing process, nitrogen (N) elements may be removed from the first metal nitride layer 62, and the first metal nitride layer 62 may become portions of the first surface layers 54.

According to some embodiments of the present inventive concept, portions of nitrogen (N) element removed from the first metal nitride layer 62 may remain in the interfacial layers 50.

The annealing process may bond the first dielectric layer 16 of the lower structure 10 to the second dielectric layer 36 of the upper structure 30. The first dielectric layer 16 and the second dielectric layer 36 may be combined into a single unitary body.

A semiconductor device according to some embodiments of the present inventive concept may include interfacial layers and pads that are entirely bonded to each other without impurities therebetween. Therefore, the interfacial layers and the pads may be strongly bonded to each other, and the semiconductor device may increase in structural stability. In addition, neither empty spaces nor other material layers may be interposed between the interfacial layers and the pads. Accordingly, small interfacial resistance may be provided between the interfacial layers and the pads, and the semiconductor device may exhibit an increase in electrical properties and operating stability.

In a method of fabricating a semiconductor device according to some embodiments of the present inventive concept, recesses formed by a first planarization process performed on the pads may be removed in a bonding process of a lower structure and an upper structure. In addition, easily removable copper nitride ($Cu_4N$) may be used to form metal nitride layers that serve as oxidation barrier layers. Therefore, neither empty spaces nor other material layers may remain between the interfacial layers and the pads, and the pads may be easily connected to each other. Accordingly, a failure may be less likely to occur in fabricating the semiconductor device.

Although the present inventive concept have been described in connection with the some embodiments illustrated in the accompanying drawings, it will be understood by one of ordinary skill in the art that variations in form and detail may be made therein without departing from the spirit and essential feature of the present inventive concept. The above disclosed embodiments should thus be considered illustrative and not restrictive.

What is claimed is:

1. A semiconductor device, comprising:
 a lower structure; and
 an upper structure on the lower structure,
 wherein the lower structure includes:
  a first semiconductor substrate;
  a first pad on the first semiconductor substrate; and
  a first dielectric layer on the first semiconductor substrate, the first dielectric layer surrounds the first pad and exposes a top surface of the first pad,
 wherein the upper structure includes:
  a second semiconductor substrate;
  a second pad on the second semiconductor substrate; and
  a second dielectric layer on the second semiconductor substrate, the second dielectric layer surrounds the second pad and exposes a bottom surface of the second pad,
 wherein the first pad and the second pad are bonded to each other across an interfacial layer to couple the upper structure and the lower structure to each other,
 wherein the first pad, the second pad, and the interfacial layer include a same metallic material, and
 wherein the first and second pads have a substantially same average grain size as each other and the interfacial layer has a different average grain size than the first and second pads.

2. The semiconductor device of claim 1, wherein:
 a top surface of the interfacial layer is positioned at a higher level than a level of an interface between the lower structure and the upper structure; and
 a bottom surface of the interfacial layer is positioned at a lower level than the level of the interface between the lower structure and the upper structure.

3. The semiconductor device of claim 1, wherein:
 the interfacial layer has a plate shape; and
 the first pad and the second pad are spaced apart from each other by the interfacial layer.

4. The semiconductor device of claim 3, wherein:
 a thickness of the first pad is substantially uniform; and
 a thickness of the second pad is substantially uniform.

5. The semiconductor device of claim 3, wherein a thickness of the interfacial layer is substantially uniform.

6. The semiconductor device of claim 1, wherein the interfacial layer contains a nitrogen (N) element disposed in the metallic material.

7. The semiconductor device of claim 6, wherein a concentration of the nitrogen element in the interfacial layer decreases in directions from the interfacial layer towards a top surface of the interfacial layer and a bottom surface of the interfacial layer.

8. The semiconductor device of claim 1, wherein the metallic material includes copper (Cu).

9. The semiconductor device of claim 1, wherein:
 the first dielectric layer and the second dielectric layer include oxide; and
 the first dielectric layer and the second dielectric layer constitute a single unitary body formed of a same material.

10. The semiconductor device of claim 1, wherein:
 a top surface of the interfacial layer is positioned at a same level as a level of an interface between the lower structure and the upper structure; or
 a bottom surface of the interfacial layer is positioned at a same level as the level of the interface between the lower structure and the upper structure.

11. The semiconductor device of claim 1, wherein a thickness of an edge portion of the interfacial layer is less than a thickness of a central portion of the interfacial layer.

12. A semiconductor device, comprising:
 a lower structure; and
 an upper structure on the lower structure, wherein the lower structure includes:
  a first semiconductor substrate;
  a first pad on the first semiconductor substrate; and
  a first dielectric layer on the first semiconductor substrate, the first dielectric layer surrounds the first pad and exposes a top surface of the first pad,
wherein the upper structure includes:
  a second semiconductor substrate;
  a second pad on the second semiconductor substrate; and
  a second dielectric layer on the second semiconductor substrate, the second dielectric layer surrounds the second pad and exposes a bottom surface of the second pad,
wherein the first pad and the second pad are bonded to each other across an interfacial layer to couple the upper structure and the lower structure to each other, and
wherein an interface between the first dielectric layer and the second dielectric layer is positioned at a level between a top surface and a bottom surface of the interfacial layer.

13. The semiconductor device of claim 12, wherein:
the first pad, the second pad, and the interfacial layer include a same metallic material, and
the first and second pads have a substantially same average grain size as each other and the interfacial layer has a different average grain size than the first and second pads.

14. The semiconductor device of claim 12, wherein:
the interfacial layer has a plate shape; and
the first pad and the second pad are spaced apart from each other by the interfacial layer.

15. The semiconductor device of claim 14, wherein:
a thickness of the first pad is substantially uniform; and
a thickness of the second pad is substantially uniform.

16. The semiconductor device of claim 14, wherein a thickness of the interfacial layer is substantially uniform.

17. The semiconductor device of claim 13, wherein the interfacial layer contains a nitrogen (N) element disposed in the metallic material.

18. The semiconductor device of claim 13, wherein the metallic material includes copper (Cu).

19. The semiconductor device of claim 12, wherein:
the first dielectric layer and the second dielectric layer include oxide; and
the first dielectric layer and the second dielectric layer constitute a single unitary body formed of a same material.

20. A method of fabricating a semiconductor device, the method comprising forming an upper structure and a lower structure, wherein the forming of the upper and lower structures includes:
  forming a dielectric layer on a semiconductor substrate;
  forming a hole in the dielectric layer;
  performing a plating process, the plating process forming a conductive layer that fills the hole and covers the dielectric layer;
  performing a planarization process on the conductive layer, the planarization process forming a pad in the hole, the pad includes a recess positioned on a top surface of the pad and extending towards the semiconductor substrate;
  performing a deposition process, the deposition process forming a surface layer on the top surface of the pad;
  performing an argon (Ar) plasma treatment process on the surface layer and the dielectric layer; and
  after performing the argon plasma treatment process, performing a nitrogen (N) plasma treatment process on the surface layer and the dielectric layer;
placing the upper structure and the lower structure in direct contact with each other, wherein the placing vertically aligns the upper structure and the lower structure with each other and a dielectric layer of the upper structure directly contacts a dielectric layer of the lower structure; and
performing an annealing process on the upper structure and the lower structure,
wherein, after the nitrogen plasma treatment process is performed, copper nitride ($Cu_4N$) is formed on a top surface of the surface layer and silicon hydroxide (Si—OH) is formed on a top surface of the dielectric layer.

* * * * *